US008539433B2

(12) United States Patent
Sato

(10) Patent No.: US 8,539,433 B2
(45) Date of Patent: Sep. 17, 2013

(54) CIRCUIT DESIGN AIDING APPARATUS AND COMPUTER-READABLE RECORDING MEDIUM STORING CIRCUIT DESIGN AIDING PROGRAM

(75) Inventor: Mitsuru Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/036,636

(22) Filed: Feb. 28, 2011

(65) Prior Publication Data

US 2011/0231807 A1 Sep. 22, 2011

(30) Foreign Application Priority Data

Mar. 19, 2010 (JP) .................................. 2010-064050

(51) Int. Cl.
*G06F 17/50* (2006.01)
*G06F 9/455* (2006.01)
*G06F 15/04* (2006.01)

(52) U.S. Cl.
USPC .......................................... 716/139; 716/132

(58) Field of Classification Search
USPC .................................................. 716/132, 139
See application file for complete search history.

(56) References Cited

U.S. PATENT DOCUMENTS

| 5,867,399 | A * | 2/1999 | Rostoker et al. ............... 716/102 |
| 6,324,678 | B1 * | 11/2001 | Dangelo et al. ............... 716/103 |
| 6,470,482 | B1 * | 10/2002 | Rostoker et al. ............... 716/102 |
| 2005/0132316 | A1 * | 6/2005 | Suaris et al. ..................... 716/11 |
| 2006/0136852 | A1 * | 6/2006 | Bourgin ............................. 716/6 |
| 2006/0190867 | A1 * | 8/2006 | Baumgartner et al. ........... 716/5 |
| 2006/0282810 | A1 * | 12/2006 | Dutt et al. ........................ 716/12 |
| 2008/0129755 | A1 | 6/2008 | Nakamura |

FOREIGN PATENT DOCUMENTS

| JP | 09-026989 | 1/1997 |
| JP | 2008/140304 | 6/2008 |

OTHER PUBLICATIONS

Notice of Reasons for Refusal dated Jul. 16, 2013 corresponding to Japanese Patent Application 2010-064050 and English Translation thereof.

* cited by examiner

*Primary Examiner* — Suresh Memula
(74) *Attorney, Agent, or Firm* — Squire Sanders (US) LLP

(57) ABSTRACT

A circuit design aiding apparatus includes a circuit data storage that stores circuit data for each circuit diagram, the circuit data containing elements in a circuit, connection between the elements, and links to constraints, a constraint data storage that stores constraint data representing design constraints, a circuit edit controller that receives and edits the circuit data through user's operation and holds an element having been edited, a constraint edit controller that receives and edits the constraint data through user's operation, a constraint updater that updates, when the circuit data is edited, the constraint data set to the edited element based on the type of the constraint and the type of the edited element, a display unit that displays the circuit data and other information, and an output data generator that generates circuit data and other data to be outputted.

5 Claims, 26 Drawing Sheets

FIG. 19

CIRCUIT DESIGN AIDING APPARATUS AND COMPUTER-READABLE RECORDING MEDIUM STORING CIRCUIT DESIGN AIDING PROGRAM

CROSS-REFERENCE TO RELATED APPLICATION

This application is based upon and claims the benefit of priority of the prior Japanese Patent Application No. 2010-064050 filed on Mar. 19, 2010, the entire contents of which are incorporated herein by reference.

FIELD

The present invention relates to a circuit design aiding apparatus for aiding in designing a circuit, such as a printed circuit board (PCB).

BACKGROUND

Development of printed circuit boards and other similar boards includes the following stages: circuit specification design, circuit design, implementation design, analysis, board prototyping, and manufacturing.

In circuit design of related art, there are few signals (or nets) to which constraints are set. The quality of circuit design can be sufficiently assured by a designer who visually checks whether or not it is appropriate to set constraints. As technologies have progressed in recent year illustrate ever, increase in transmission rate (higher than 100 MHz), decrease in drive voltage, and other factors increase the proportion of signals and other targets to which constraints are set. That makes manual management of constraint setting difficult.

In view of the background described above, there has been a known (constraint-driven) design approach in which the quality of circuit design is assured by defining design constraints in an upstream design stage (circuit design stage, for example) and checking design rules (DRC) in a downstream design stage (implementation design stage, for example).

In circuit design CAD systems, there have been several known methods for representing and processing constraints.

There has been a known CAD apparatus for displaying the data in layers containing elements of circuit design drawing data to edit the circuit design drawing data in an efficient manner. In the editing operation performed in the CAD apparatus, a data structure in which the elements are related to each other is first generated. When an element is deleted in any of the layers, other elements related to the element in the data structure are also deleted.

Further, there has been a known apparatus that prevents any reading error when a printed instruction document is read by a person. In the apparatus, when a character string added to a figure in drawing data in a system is displayed on a screen of another system, the added character string is also displayed.

The following are documents which describe technical backgrounds of the discussed embodiment: Japanese Patent Laid-Open No. 2008-140304 and H9-26989.

In circuit design based on the constraint-driven design approach described above, the circuit design is, in general, frequently corrected due to change in circuit specifications, change in parts of the circuit, and other reasons. It is therefore very important to change related constraints in synchronization with the change in the circuit design.

However, information on specifications of circuit design (like circuit design specifications) and information on design constraints (like constraint conditions) are managed separately, and a designer corrects the circuit design specifications and the constraints separately in related art.

Specifically, in general, a circuit designer inputs circuit drawing data and then inputs constraint data. As a result, when the circuit designer corrects the circuit drawing after having input the constraint data, the circuit designer has to correct the constraints to reflect the correction of the circuit drawing in the constraints. For example, when the name of a part incorporated in a circuit is changed, it is necessary to correct the name of the part in a related constraint.

The number of necessary constraints tends to be enormous as the density in circuit design increases. As a result, when a circuit drawing is corrected, the number of steps of correcting a related constraint so that it agrees with the correction increases, resulting in significant efforts for the correction.

The present inventor has studied several system approaches to automatic update of constraint data after circuit data is edited and has found the following problems:

(1) Approach to Constraint Data Update Based on Edited Circuit Data:

After circuit data correction, to allow the system to update constraint data automatically in accordance with the correction, the system needs to know which element (such as a part and a net) in the circuit has been edited and what kind of editing has been made on the element (added, deleted, or moved, for example). Therefore, after the circuit data has undergone several editing operations, an attempt to update a constraint effective before the editing operations based on the edited circuit data will not be successful.

(2) Approach to Constraint Data Update Whenever Circuit Data is Edited:

Whenever circuit data is edited, related constraint data can be updated. In this case, however, there is a concern about decrease in editing speed as the density in circuit design has increased in recent years. That is, since circuit data to be created in circuit design greatly increases in recent years, the number of constraints to be created also greatly increases, which makes it unrealistic to extract and update, whenever circuit data is edited, all related constraints because the circuit data editing speed decreases accordingly. Specifically, when 5000 constraints are set and 5 elements in average are related to each of the constraints, the number of elements related to the constraints is 5000×5=25000.

Whenever an element is edited, a constraint related to the element needs to be updated. In this case, it is necessary to search the 25000 elements to which constraints have been set for a constraint to be updated. Further, when an element to which no constraint has been set is edited, unnecessary constraint search is disadvantageously carried out although no constraint update is necessary.

The above and other objects and novel features of the present invention are apparent from the description of the specification when taken in connection with the accompanying drawings.

SUMMARY

In an exemplary aspect of the invention, a circuit design aiding apparatus discussed herein includes 1) a circuit data storage that stores circuit data for each circuit diagram, the circuit data containing elements that form a circuit and links to constraints having been set, 2) a constraint data storage that stores constraint data for each circuit diagram, the constraint data containing an element which is used in the circuit and to which a constraint is set and contents of the constraint, 3) a circuit edit controller that edits contents of the circuit data stored in the circuit data storage and updates the circuit data so that the updated circuit data reflects the edited contents, and a 4) constraint updater that extracts circuit data on an element having been edited from the circuit data storage, identifies constraint data related to the edited element from the constraint data storage based on a link to a constraint in the extracted circuit data, and changes contents of the identified constraint data.

In another exemplary aspect of the invention, a computer-readable recording medium is discussed, which stores a program that instructs a computer to carry out processes run on the circuit design aiding apparatus described above.

The object and advantage of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 19 illustrates an exemplary selected element table in an embodiment.

DESCRIPTION OF EMBODIMENTS

A circuit design aiding system disclosed as an embodiment of the present invention will be described below.

Figure 1:
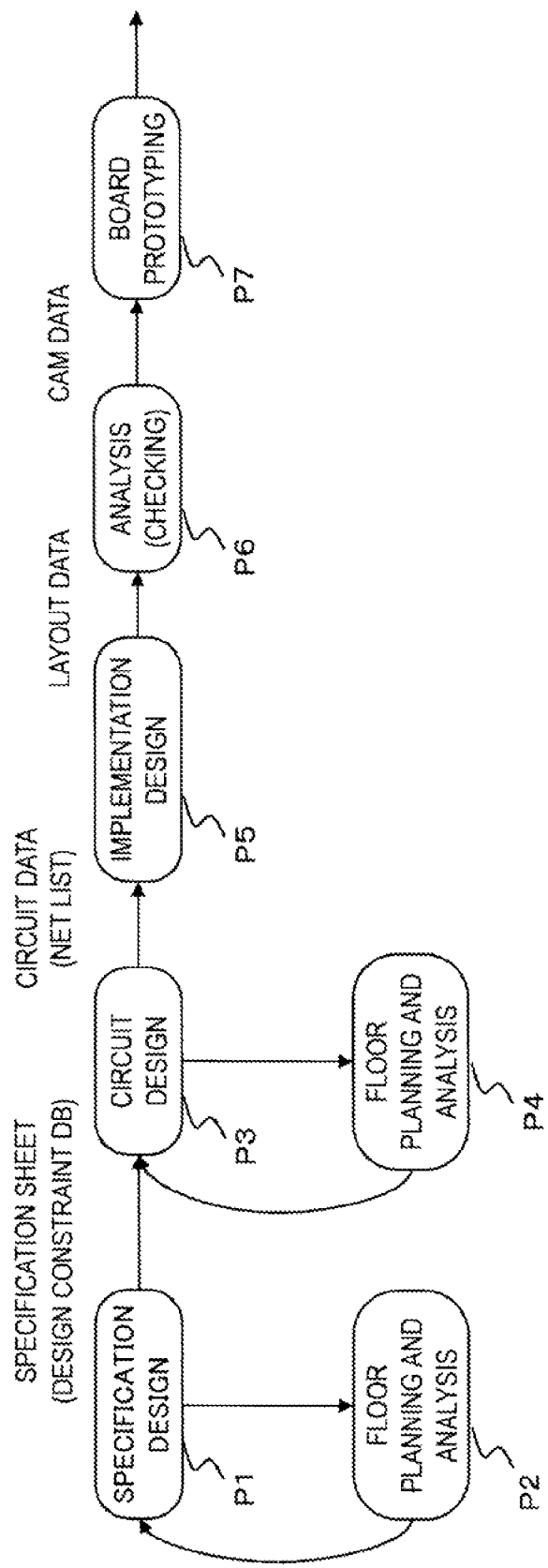
FIG. 1 illustrates exemplary steps of developing a printed circuit board in an embodiment.

FIG. 1 illustrates exemplary steps of developing a printed circuit board.

In printed circuit board design, the following work is carried out in each of the steps illustrated in FIG. 1.

Specification design (P1): a process in which a designer determines specifications, such as system requirements (for example, intended functions, part configuration, operating frequency, and bus configuration) and manufacturing conditions (such as layout constraints and the number of layers). A specification sheet (specification data) on which the specifications are written is outputted.

Floor planning and analysis (P2): a process in which a designer checks constraints on circuit design (P3) based on the specifications so that no problem occurs in a printed circuit board manufacturing step and then creates constraint data. The constraint data is outputted.

The constraint data represents constraints (instructions) on circuit design (P3), such as part layout positions, wiring line lengths, wiring line spacings, the number of bypass capacitors, and other net states.

Circuit design (P3): a design process in which a circuit designer connects a plurality of parts (such as ICs, resistors, and capacitors), a power supply, a ground line, and other components with nets (lines) in order to achieve the functions of the system. The circuit designer also sets constraints as required. The circuit data and the constraint data are outputted.

The circuit data contain the parts, the power supply, the ground line, and other components on the printed circuit board and information used to connect the above components (net list).

Floor planning and analysis (P4): a process in which a designer checks and creates constraints on implementation design (P5) so that no problem occurs in the printed circuit board manufacturing step.

The constraint data represents constraints on the implementation design (P5).

Implementation design (P5): a design process in which an implementation designer uses the net list and the constraint data created in the circuit design (P3) to place the parts on the printed circuit board and wire them under specified constraints.

Layout data containing not only the net list information but also information on actual shapes of the parts and nets and positions thereof on the board, which is created in the implementation design (P5), is outputted.

Analysis (checking) (P6): a process in which the layout data is used to perform analysis to see if any manufacturing problem occurs. The same process as that in the floor planning and analysis (P2 and P4) is carried out but in a more precise manner because the layout data is used.

In this process, the layout data are converted into CAM data (CAM: Computer Aided Manufacturing). The CAM data, which is used to manufacture an actual printed circuit board in the manufacturing step, is forwarded to a manufacturing line in a manufacturing factory.

Board prototyping (P7): a process in which the printed circuit board is manufactured. The prototype printed circuit board is used to carry out a real product test. When no problem is found in the test, actual products will be manufactured in a mass-production step.

In the circuit design step (P3) illustrated in FIG. 1, the circuit designer uses the circuit design aiding system primarily to design logical connection between the parts and output circuit data and constraint data. In the implementation design step (P5), the implementation designer designs actual layout and wiring on the printed circuit board based on the circuit data and the constraint data.

The constraint data is forwarded from the circuit design step (P3) to the implementation design step (P5) separately from the circuit data. The constraints have been forwarded in the form of printed matter, such as an "implementation instruction document," but in recent years the constraints are forwarded as electronic data from the circuit design aiding system (circuit design CAD system) to an implementation design aiding system (implementation design CAD system).

The circuit data along with the constraint data are forwarded, for example, as EDIF (Electronic Design Interchange Format) data. EDIF is a neutral, electronic design data exchange format (data format) for representing a circuit diagram and wiring information (net list) of an electronic circuit.

Figure 2:
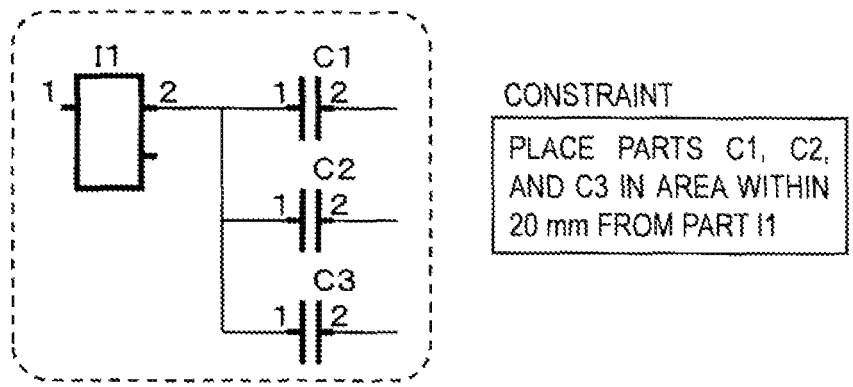
FIG. 2 illustrates an exemplary instruction about part layout in an embodiment.

The instructions specified in the constraint data relate to part layout positions, part arrangement, the states of nets (lines), and other information. Examples of the constraint data follow:

FIG. 2 illustrates an exemplary instruction about the part layout.

A "part layout" is an instruction to identify an arbitrary part and then place another part in the vicinity of the arbitrary part. For example, FIG. 2 illustrates a constraint on placement of parts C1, C2, and C3 in an area within 20 millimeters [mm] from a part I1.

Figure 3:
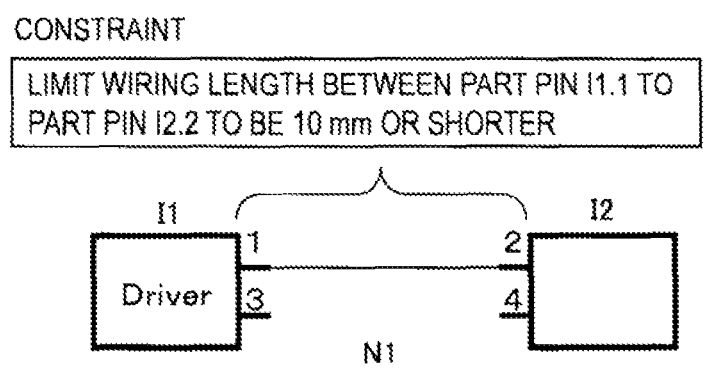
FIG. 3 illustrates an instruction on the state of a net, an exemplary instruction on net wiring length, in an embodiment.

FIG. 3 illustrates an instruction on the state of a net, an exemplary instruction on net wiring length.

A "net wiring length" is an instruction to specify the wiring length of a net connected between part pins. For example, FIG. 3 illustrates a constraint that the wiring length from a part pin 1 of a part I1 (hereinafter referred to as a part pin 11.1) to a part pin 2 of a part I2 (hereinafter referred to as a part pin I2.2) is 10 mm or shorter.

Figure 4A:
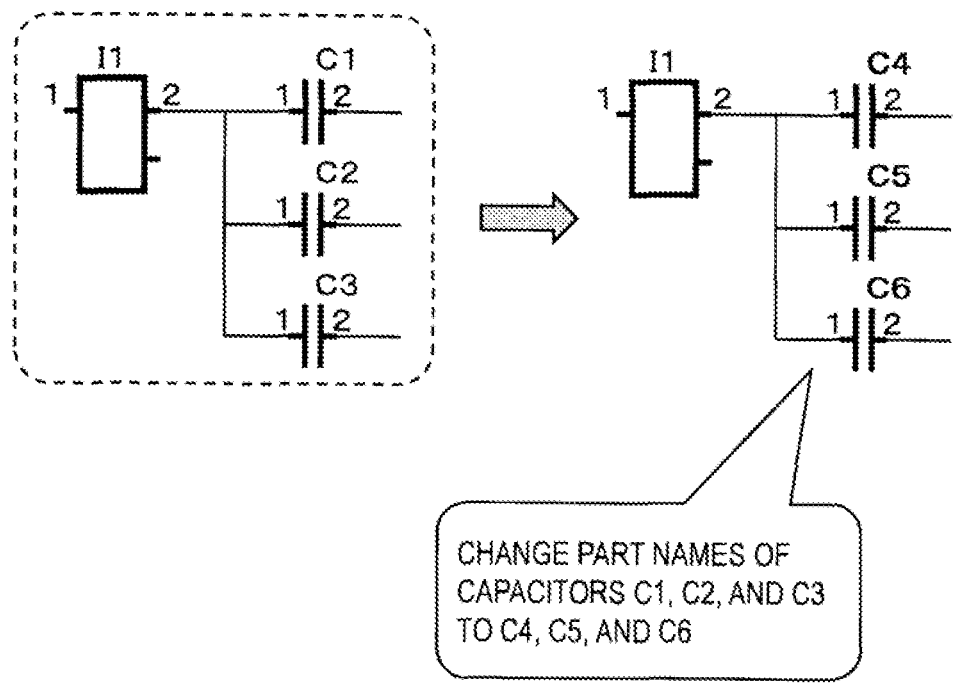
FIGS. 4A and 4B illustrate an example of change in circuit data and constraint data in an embodiment.
Figure 4B:
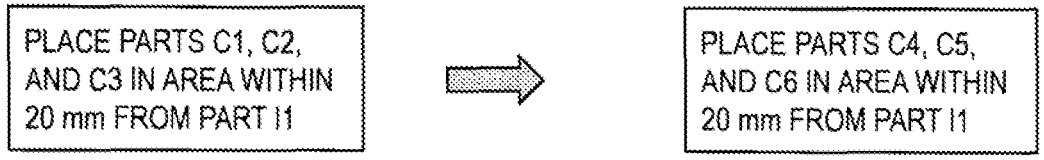

A description will next be made of a problem studied by the present inventor in the circuit design steps illustrated in FIG. 1. FIGS. 4A and 4B illustrate an example of change in circuit data and constraint data in an embodiment.

In the development steps illustrated in FIG. 1, the circuit designer typically inputs circuit diagram data and then inputs constraints based on the specifications. In the thus performed development steps, consider a case where the circuit designer edits the circuit data and changes the names of the parts (capacitors) C1 to C3 to be mounted on the printed circuit board to C4 to C6 as illustrated in FIG. 4A. In the changing operation, the part names of the relevant parts (capacitors) in the circuit data are changed from C1, C2, and C3 to C4, C5, and C6. When the parts having been edited by the user have a constraint on placement of the parts C1, C2, and C3 in an area within 20 mm from the part I1, it is necessary to search for constraints set to the parts having been edited and change the part names in the searched constraint data to C4, C5, and C6, as illustrated in FIG. 4B.

Figure 5:
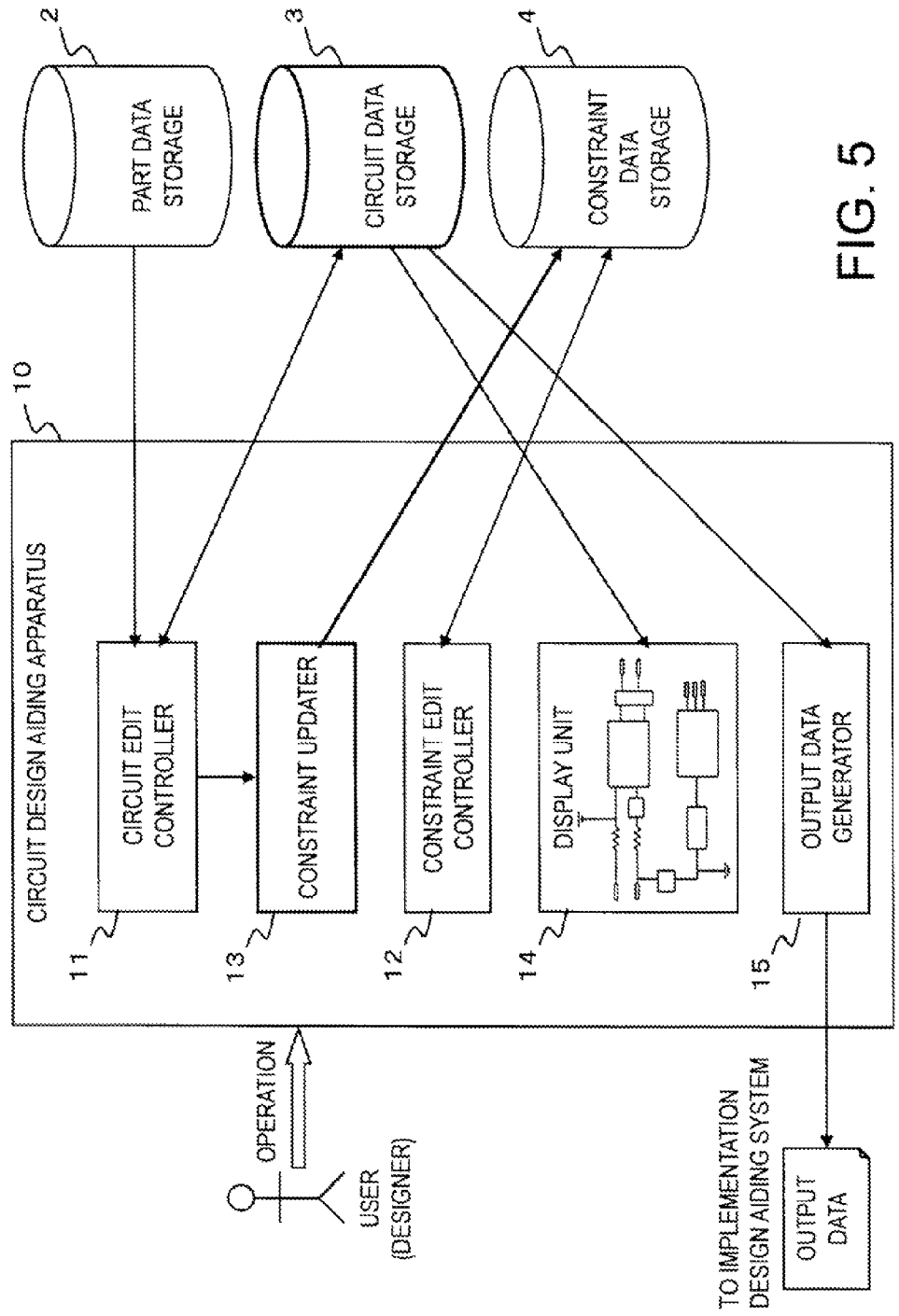
FIG. 5 illustrates an exemplary configuration in an embodiment of a circuit design aiding system.

FIG. 5 illustrates an exemplary configuration in an embodiment of the circuit design aiding system disclosed in the present application.

A circuit design aiding system 1 is a CAD system that aids in circuit design and includes a circuit design aiding apparatus 10, a part data storage 2, a circuit data storage 3, and a constraint data storage 4.

A user, who is a designer, operates the circuit design aiding apparatus 10 to design a circuit and set constraints, and the circuit design aiding apparatus 10 outputs data to be used in implementation design. The circuit design aiding apparatus 10 includes a circuit edit controller 11, a constraint edit controller 12, a constraint updater 13, a display unit 14, and an output data generator 15.

The part data storage 2 saves library data representing types and specifications of parts to be used in a circuit. Part data contain information on the type, shape, model, specifications, price, manufacturer, and other factors of each of the parts.

The circuit data storage 3 stores circuit data having been inputted or edited through user's operation. The circuit data is information representing elements that form the circuit and connection between the elements and contains information on parts that form the circuit, part pins of the parts, and nets (lines) that connect the part pins. One set of circuit data is created for each circuit diagram.

The constraint data storage 4 stores constraint data having been inputted or edited through user's operation. Constraint data is information representing constraints on the layout of and wiring between the elements that form the circuit. One set of constraint data is created for each constraint.

The part data storage 2, the circuit data storage 3, and the constraint data storage 4 can be provided as external storage devices or another database system.

The circuit edit controller 11 in the circuit design aiding apparatus 10 is a processor that creates or edits a circuit diagram in response to user's operation via input means (not illustrated), such as a mouse and a keyboard, and stores circuit data corresponding to the circuit diagram in the circuit data storage 3.

The circuit edit controller 11 selects a part to be used from the part data storage 2 and inputs the part to the circuit diagram so as to create circuit data in response to user's operation, stores the circuit data in the circuit data storage 3, and edits circuit data stored in the circuit data storage 3.

The constraint edit controller 12 is a processor that creates constraint data representing constraints in response to user's operation via the input means, stores the constraint data in the constraint data storage 4, and edits constraint data stored in the constraint data storage 4.

The constraint updater 13 is a processor that accesses the constraint data storage 4 to select constraint data related to an element having been edited in a circuit data edit process performed by the circuit edit controller 11 and makes a necessary update on the selected constraint data.

The display unit 14 is a processor that displays a circuit diagram or constraints on a display or any other output means (not illustrated) based on circuit data in the circuit data storage 3 or constraint data in the constraint data storage 4.

The output data generator 15 is a processor that outputs data from the circuit data storage 3 and the constraint data storage 4 and forwards the data to an implementation design aiding system used in the implementation design step.

A description will next be made of data used in the circuit design aiding system 1.

Figure 6:
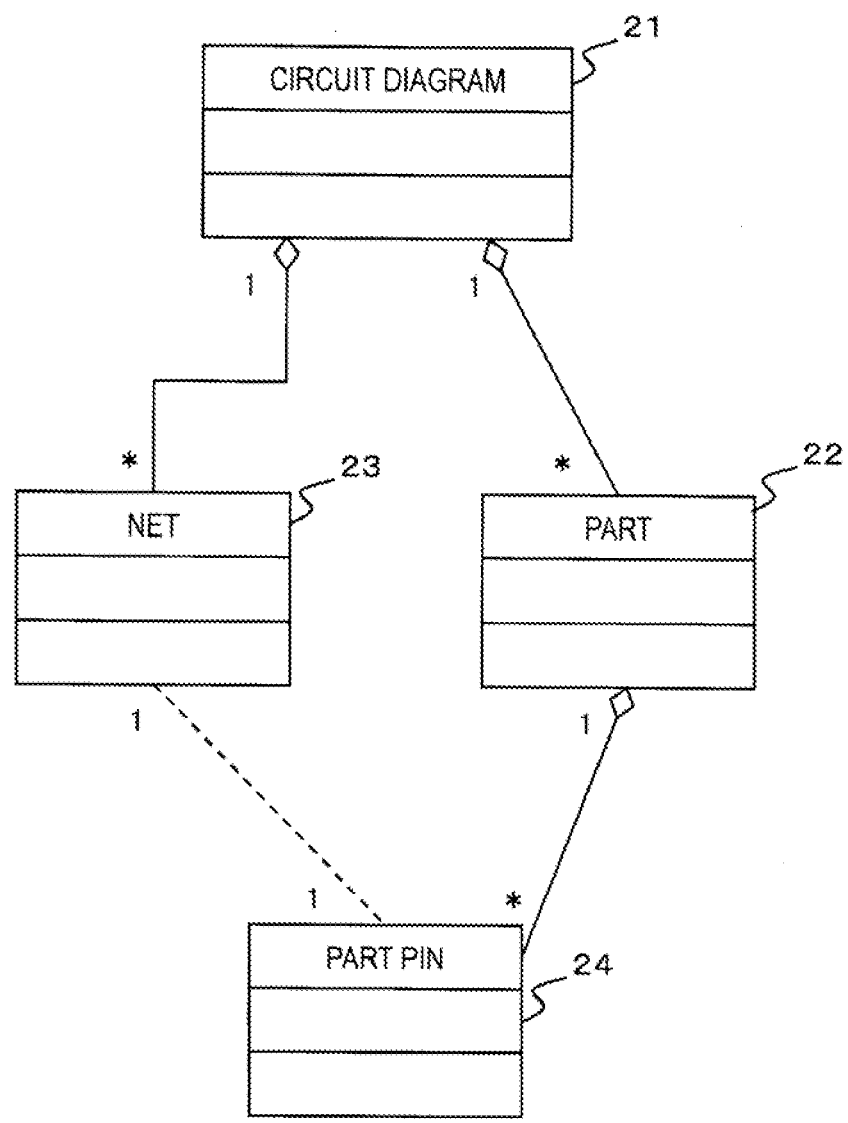
FIG. 6 illustrates an exemplary configuration of data in a circuit data storage in an embodiment.

FIG. 6 illustrates an exemplary configuration of data in the circuit data storage 3.

The circuit data storage 3 stores one set of circuit data for each circuit diagram. One set of circuit data is formed of a circuit diagram table 21, a part table 22, a net table 23, and a part pin table 24. The four tables are linked to each other in accordance with the configuration of the circuit diagram.

The circuit diagram table 21 is a data table that manages the information on an entire circuit diagram. One circuit diagram table is created for each circuit diagram. The circuit diagram table 21 is linked to a plurality of part tables 22 and net tables 23.

Each of the part tables 22 is a data table that manages information on a part contained in the circuit diagram table 21. When the user adds a part to the circuit diagram, a part table 22 is added to the circuit diagram table 21. Each of the part tables 22 is linked to a plurality of part pin tables 24.

The part pin tables 24 are data tables that manage information on one or more part pins of a part. Each of the part pin tables 24 is linked to the parent part table 22 and the net table 23 for the net connected to the part pin.

One single part pin table 24 does not belong to a plurality of part tables 22 (parents). Further, since the number of part pins of a part is defined by library data on the part in the part data storage 2, the user cannot change the number of part pins in the circuit design stage.

When a part is added to the circuit diagram and a part table 22 for the added part is created, part pin tables 24 are automatically created and the number of the thus created part pin tables 24 corresponds to the number of pins of the part.

The net tables 23 are data tables that manage information on nets contained in the circuit diagram tables 21. When the user adds a net to the circuit diagram, a net table 23 is added to the circuit diagram table 21. Each of the net tables 23 is linked to the part pin table 24 for the part pin connected to the net.

Figure 7:
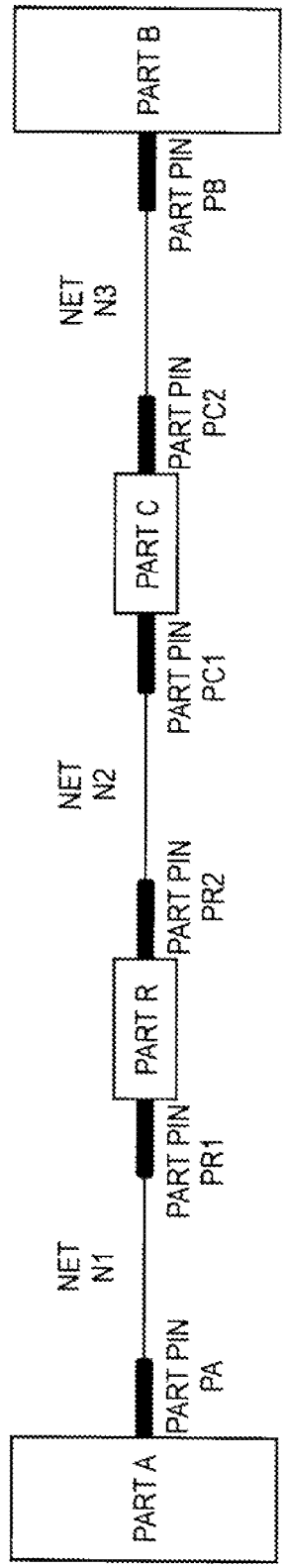
FIG. 7 illustrates an exemplary circuit diagram in an embodiment.
Figure 8:
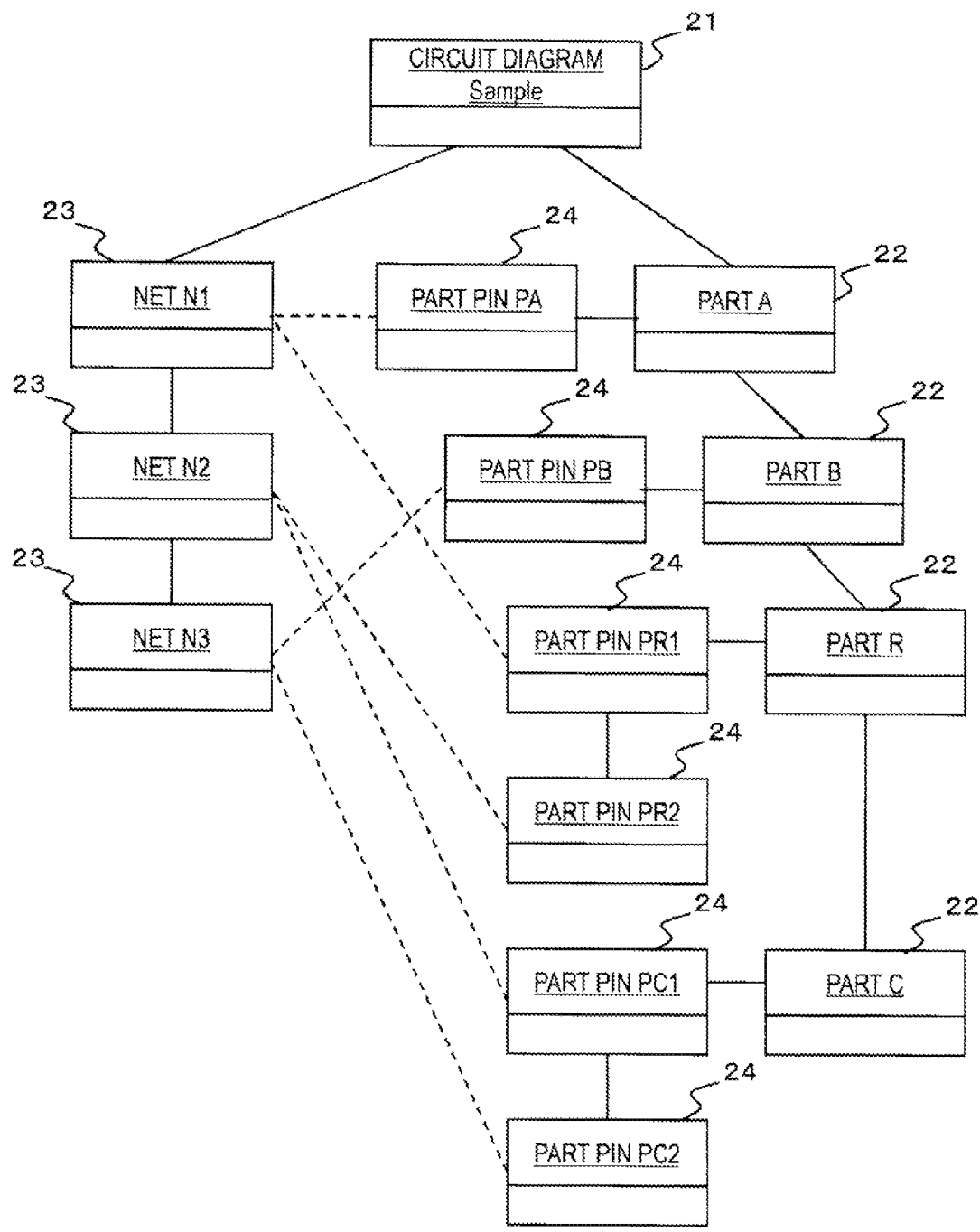
FIG. 8 illustrates an exemplary configuration of circuit data on the circuit diagram illustrated in FIG. 7.

FIG. 7 illustrates an exemplary circuit diagram, and FIG. 8 illustrates an exemplary configuration of circuit data on the circuit diagram illustrated in FIG. 7.

A circuit diagram Sample illustrated in FIG. 7 is formed of a part A having a part pin PA, a part R having part pins PR1 and PR2, a part C having part pins PC1 and PC2, and a part B having a part pin PB. The part pins PA and PR1 are connected with a net N1. The part pins PR2 and PC1 are connected with a net N2. The part pins PC2 and PB are connected with a net N3.

As illustrated in FIG. 8, circuit data representing the circuit diagram Sample is formed of a "Sample table," which is a circuit diagram table 21, a "table A," a "table B," a "table R," and a "table C," which are part tables 22, a "table N1," a "table N2," and a "table N3," which are net tables 23, a "table PA," a "table PB," a "table PR1," a "table PR2," a "table PC1," and a "table PC2," which are part pin tables 24. The "Sample table" is linked to each of the part tables and each of the net tables, and each of the part tables is linked to the part pin table(s) for the part pin(s) of the part. Further, each of the net tables is linked to the part pin tables for the part pins connected to the net.

Figure 9A:
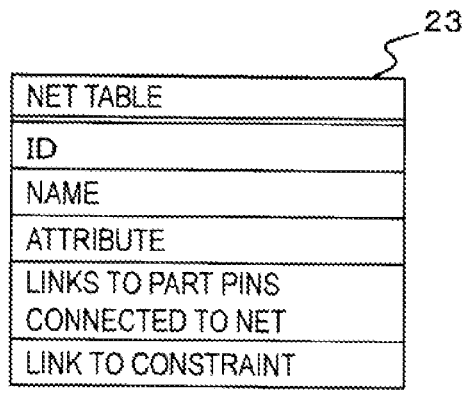
FIGS. 9A to 9C illustrate exemplary configurations of data in a circuit data storage in an embodiment.
Figure 9B:
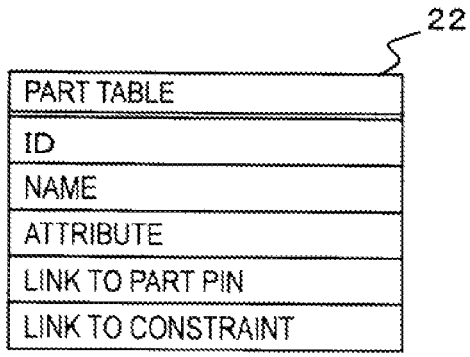
Figure 9C:
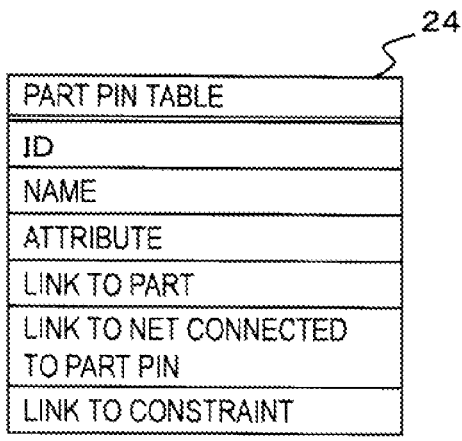

FIGS. 9A to 9C illustrate exemplary configurations of data in a net table, a part table, and a part pint table.

The net table 23 illustrated in FIG. 9A has data items (storage areas), such as an ID, a name, an attribute, links to the part pins connected to the net, and a link to a constraint.

The "ID" is an area that stores information by which the net table 23 is uniquely identified in the circuit data storage 3. The "name" is the name of the net. The "attribute" is an area that stores the properties of the net and other information thereon. The attribute will not be described in detail because it is not directly related to the present invention. The "links to the part pins connected to the net" is an area that stores information representing links to the part pin tables 24 for the part pins connected to the net. The "link to a constraint" is an area that stores information on the link to constraint data set to the net.

The part table 22 illustrated in FIG. 9B has data items (storage areas), such as an ID, a name, an attribute, a link to a part pin, and a link to a constraint.

The "ID" is an area that stores information by which the part table 22 is uniquely identified in the circuit data storage 3. The "name" is the name of the part. The "attribute" is an area that stores the properties of the part and other information thereon. The attribute will not be described in detail for the same reason described above. The "link to a part pin" is an area that stores information representing a link to the part pin table 24 for a part pin of the part. The "link to a constraint" is an area that stores information on a link to constraint data set to the part.

The part pin table 24 illustrated in FIG. 9C has data items (storage areas), such as an ID, a name, an attribute, a link to the part, a link to the net connected to the part pin, and a link to a constraint.

The "ID" is an area that stores information by which the part pin table 24 is uniquely identified in the circuit data storage 3. The "name" is the name of the part pin. The "attribute" is an area that stores the properties of the part pin and other information thereon. The attribute will not be described in detail for the same reason described above. The "link to the part" is an area that stores information representing a link to the part table 22 for the part to which the part pin belongs. The "link to the net connected to the part pin" is an area that stores information on a link to the net connected to the part pin. The "link to a constraint" is an area that stores information on a link to constraint data set to the part pin.

The "link to a constraint" in each of the net table 23, the part table 22, and the part pin table 24 is an information storage area newly added to circuit data used in the circuit design aiding system 1 disclosed as an embodiment of the present invention.

Figure 10:
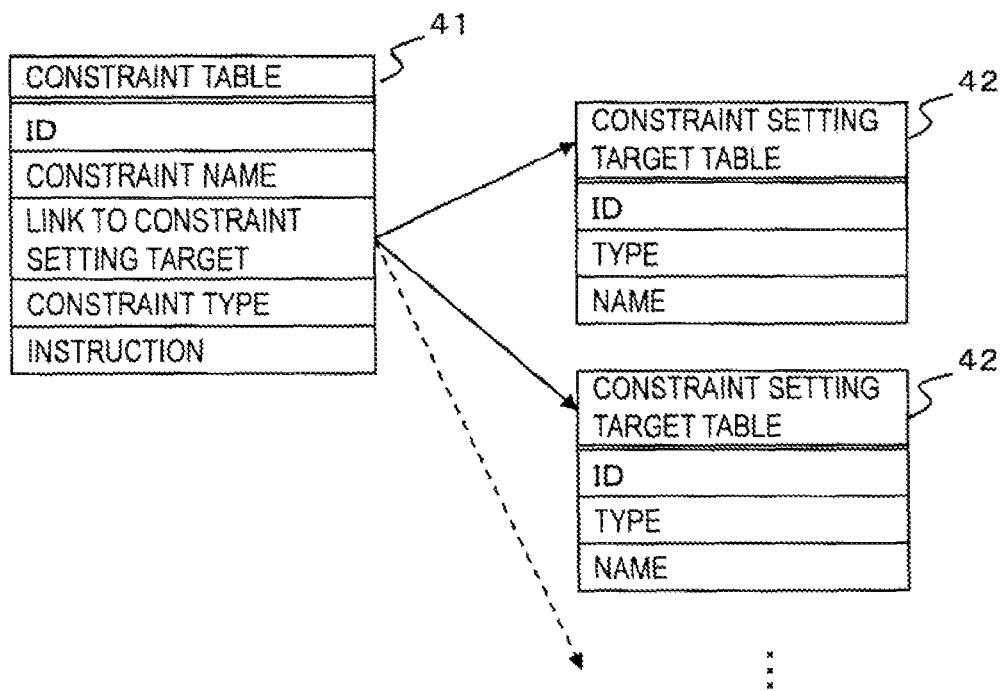
FIG. 10 illustrates an exemplary configuration of data in a constraint data storage in an embodiment.

FIG. 10 illustrates an exemplary configuration of data in the constraint data storage 4.

The constraint data storage 4 stores one set of constraint data for each constraint. Constraint data is formed of a constraint table 41 and a constraint setting target table 42.

The constraint table 41 has data items (storage areas), such as an ID, a constraint name, a link to a constraint setting target, a constraint type, and an instruction.

The "ID" is an area that stores, when the constraint is created, information by which the constraint table 41 is uniquely identified in the constraint data storage 4. The "constraint name" is the name of the constraint. The "link to a constraint setting target" is an area that stores information representing a link to a target (part, net, and part pin) to which the constraint is set. A single constraint setting target table 42 is created for each element to which the constraint is set, and a link is set to the table.

The "constraint type" is an area that stores information representing the type of the constraint (wiring length and part layout, for example). The "instruction" is an area that stores information representing an instruction of the constraint (for example, a specific value of the wiring length, such as "20 mm or shorter").

The constraint setting target table 42 has data items (storage areas), such as an ID, a type, and a name.

The "ID" is an area that stores information by which a target to which the constraint is set is uniquely identified in the circuit data storage 3.

The "type" is an area that stores information representing the type of the element (part, part pin, and net) to which the constraint is set. The "name" is an area that stores information representing the name of the element to which the constraint is set.

Examples of the constraint described in the "instruction" in the constraint table 41 follow:

(1) Constraint on Part Layout

An exemplary constraint on a part layout will be described with reference to FIGS. 11 and 12.

A constraint on a part layout constrains the layout of parts to be implemented on a printed circuit board. As an exemplary constraint on a part layout, assume that the following instruction is set as illustrated in FIG. 11: "Place parts C1, C2, and C3 in an area within 20 mm from a part I1."

Figure 11:
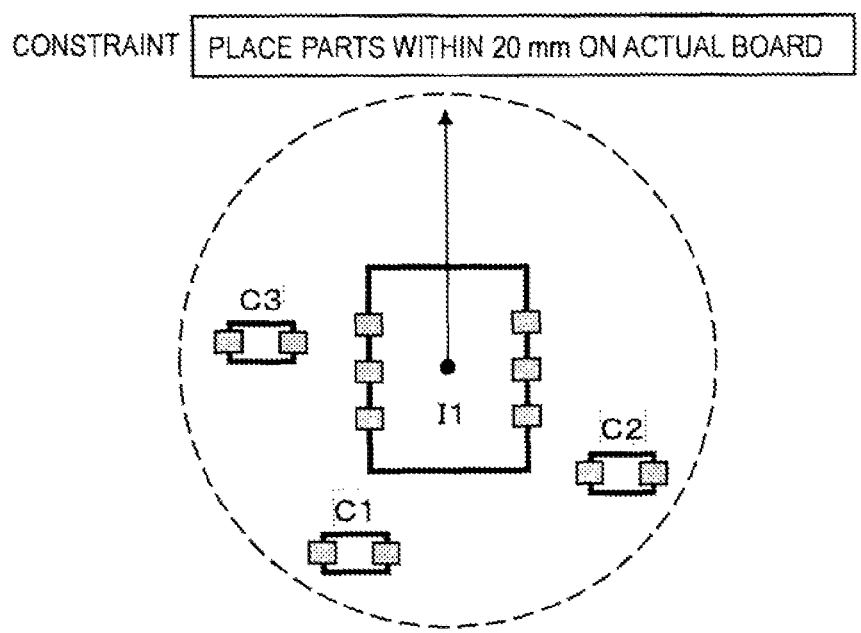
FIG. 11 illustrates an exemplary constraint on a part layout in an embodiment.
Figure 12:
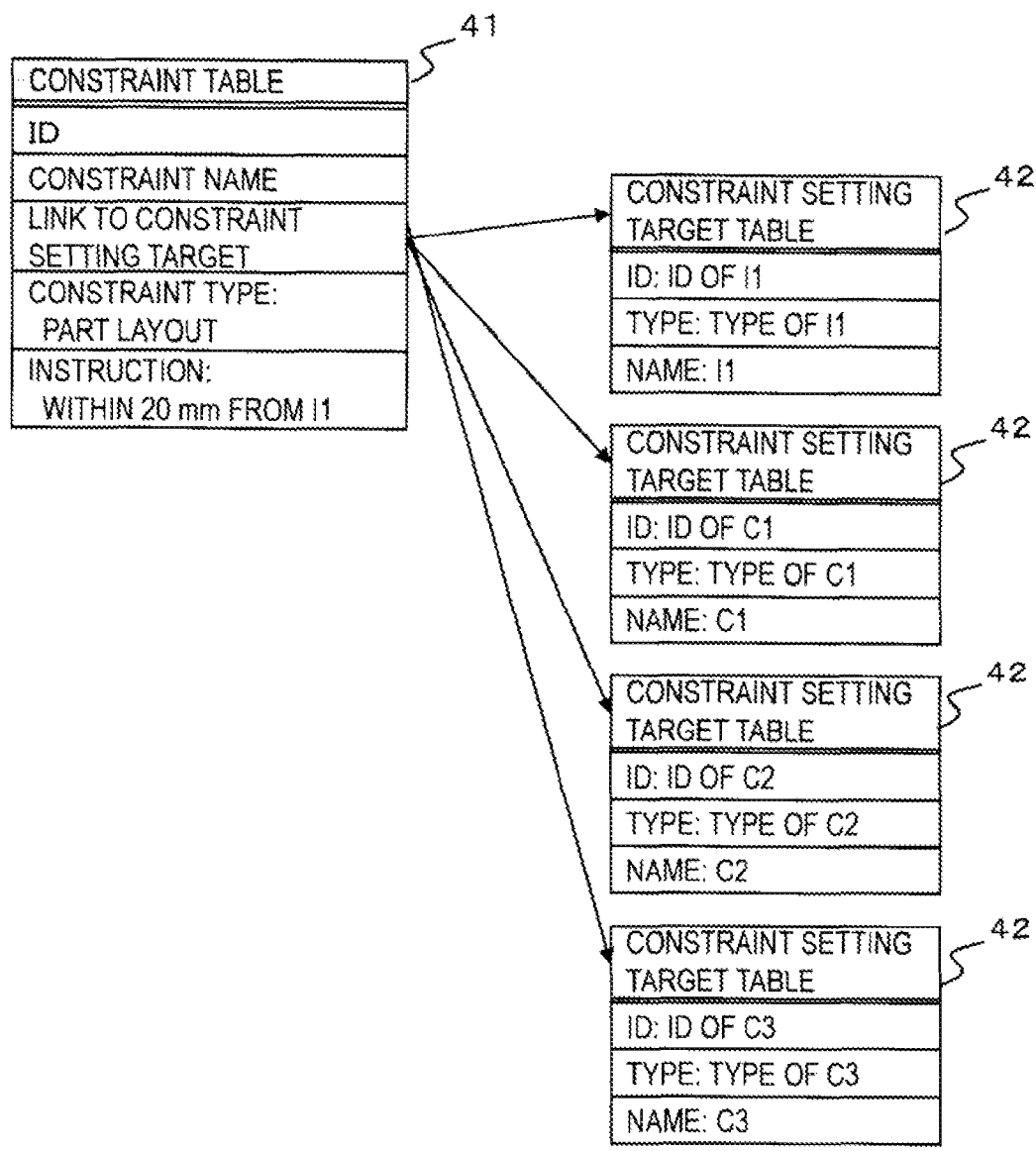
FIG. 12 illustrates exemplary constraint data representing the constraint illustrated in FIG. 11.

FIG. 12 illustrates exemplary constraint data representing the constraint illustrated in FIG. 11.

One constraint table 41 and four constraint setting target tables 42 corresponding to the four elements (I1, C1, C2, and C3) related to the constraint are created as the constraint data.

In the constraint table 41, the description of "within 20 mm from the part I1" is made as the instruction, and links to the four constraint setting target tables 42 are set as the "link to a constraint setting target."

(2) Constraint on Path

An exemplary constraint on a path will be described with reference to FIGS. 13 and 14.

A constraint on a path constrains part arrangement. As an exemplary constraint on a path, assume that the following instruction is set as illustrated in FIG. 13: "Limit wiring length from a part pin 11.1 to a part pin 12.2 to be 10 mm or shorter."

Figure 13:
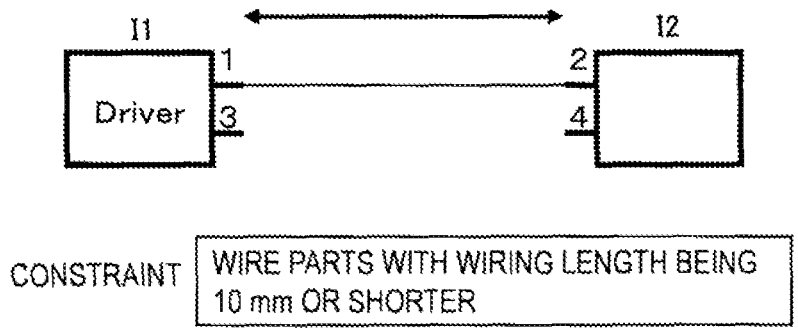
FIG. 13 illustrates an exemplary constraint on a path in an embodiment.
Figure 14:
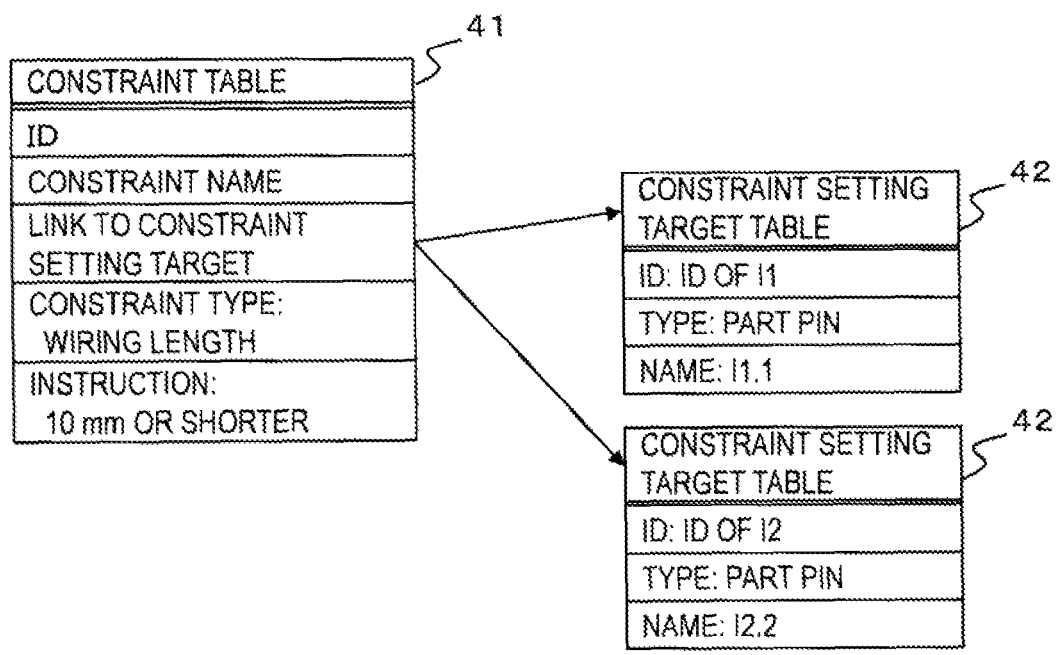
FIG. 14 illustrates exemplary constraint data representing the constraint illustrated in FIG. 13.

FIG. 14 illustrates exemplary constraint data representing the constraint illustrated in FIG. 13.

One constraint table 41 and two constraint setting target tables 42 corresponding to the two elements (part pins 11.1 and 12.2) related to the constraint are created as the constraint data.

In the constraint table 41, the description of "within 10 mm" is made as the instruction, and links to the two constraint setting target tables 42 are set as the "link to a constraint setting target."

(3) Constraint on Net

An exemplary constraint on a net will be described with reference to FIGS. 15 and 16.

A constraint on a net constrains the state of a net itself that connects parts to be implemented on a printed circuit board. As an exemplary constraint on a net, assume that the following instruction on the number of vias along a specified net is set as illustrated in FIG. 15: "At least two vias are necessary along a net N1."

Figure 15:
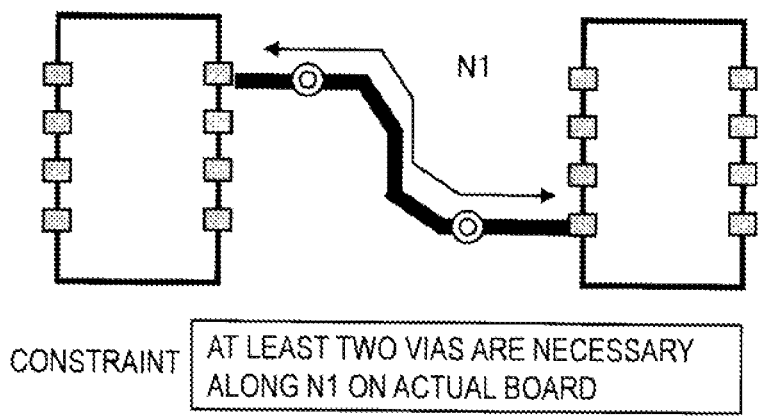
FIG. 15 illustrates an exemplary constraint on a net in an embodiment.
Figure 16:
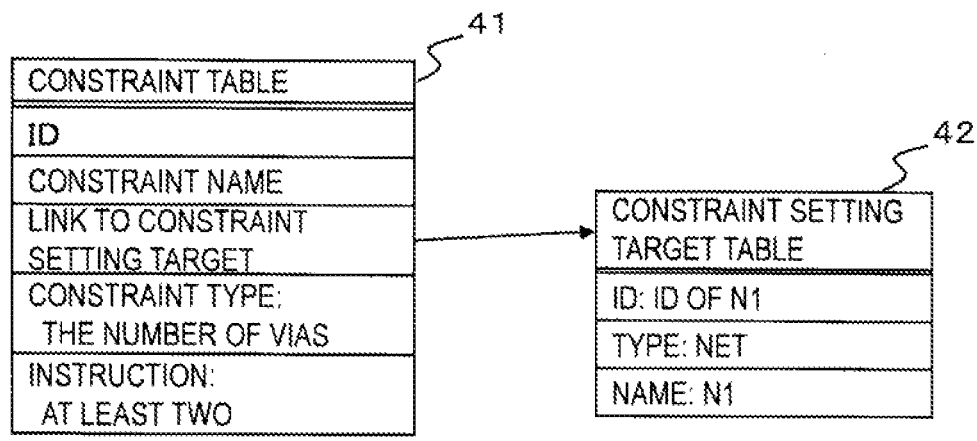
FIG. 16 illustrates exemplary constraint data representing the constraint illustrated in FIG. 15.

FIG. 16 illustrates exemplary constraint data representing the constraint illustrated in FIG. 15.

One constraint table 41 and one constraint setting target table 42 corresponding to one element (N1) related to the constraint are created as the constraint data.

In the constraint table 41, descriptions of "the number of vias" and "at least two" are made as the constraint type and the instruction, respectively, and a link to the one constraint setting target table 42 is set as the "link to a constraint setting target."

A description will next be made of a process flow in the circuit design aiding apparatus 10.

Figure 17:
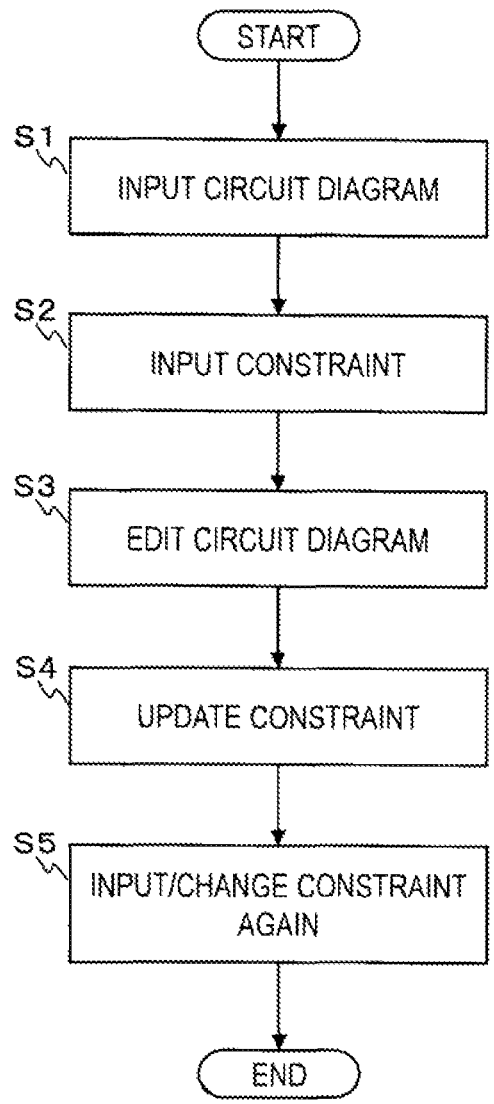
FIG. 17 illustrates a summary of a process flow in a circuit design aiding apparatus disclosed as an embodiment.

FIG. 17 illustrates a summary of the process flow in the circuit design aiding apparatus 10.

Input Circuit Diagram (Step S1):

When the user inputs a circuit diagram via the input means, the circuit edit controller 11 in the circuit design aiding apparatus 10 creates circuit data based on the data inputted by the user and the part library data in the part data storage 2 and stores the circuit data in the circuit data storage 3. Actions of the circuit edit controller 11 in the circuit diagram input process will not be described in detail because they are the same as those in a circuit diagram input process in a typical circuit design CAD system.

Input Constraint (Step S2):

When the user inputs a constraint via the input means, the constraint updater 13 creates constraint data based on the user's operation and stores the constraint data in the constraint data storage 4.

Figure 18:
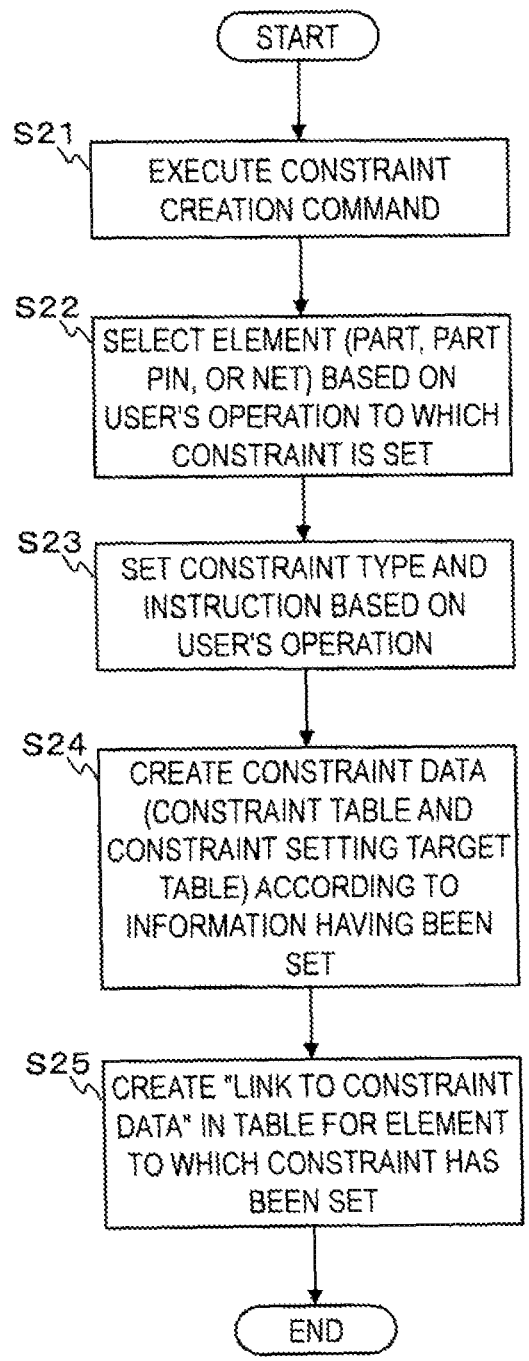
FIG. 18 is a flowchart illustrating a constraint input process (step S2) in more detail.

FIG. 18 is a flowchart illustrating the constraint input process (step S2) in more detail.

When a constraint creation command is executed, the circuit design aiding apparatus 10 activates the constraint edit controller 12 (step S21). The constraint edit controller 12 selects an element (part, part pin, or net) based on user's operation via the input means to which the constraint is set (step S22) and sets the constraint type and the instruction (step S23).

The constraint edit controller 12 creates constraint data (constraint table 41 and constraint setting target table 42) according to the information set in the steps S22 and S23 and stores the constraint data in the constraint data storage 4 (step S24).

The constraint updater 13 then uses the circuit data in the circuit data storage 3 to set the "link to a constraint" created in the table for each element to which the constraint has been set (step S25). Specifically, the constraint updater 13 extracts a part table 22, a part pin table 24, and a net table 23 from the circuit data in the circuit data storage 3 based on the ID of each element to which the constraint has been set and sets the ID in the created constraint table 41 in the "link to a constraint" in each of the extracted tables.

Edit Circuit Diagram (Step S3):

When the user edits the circuit diagram via the input means, the circuit edit controller 11 corrects the circuit diagram data read from the circuit data storage 3 based on the user's editing operation to update the circuit data. When the user starts editing, the circuit edit controller 11 creates a selected element table 18, extracts the ID of the element (selected element) which is selected by the user's editing operation from the corresponding table as a target to be edited, and registers the ID in the selected element table 18.

Figure 19:
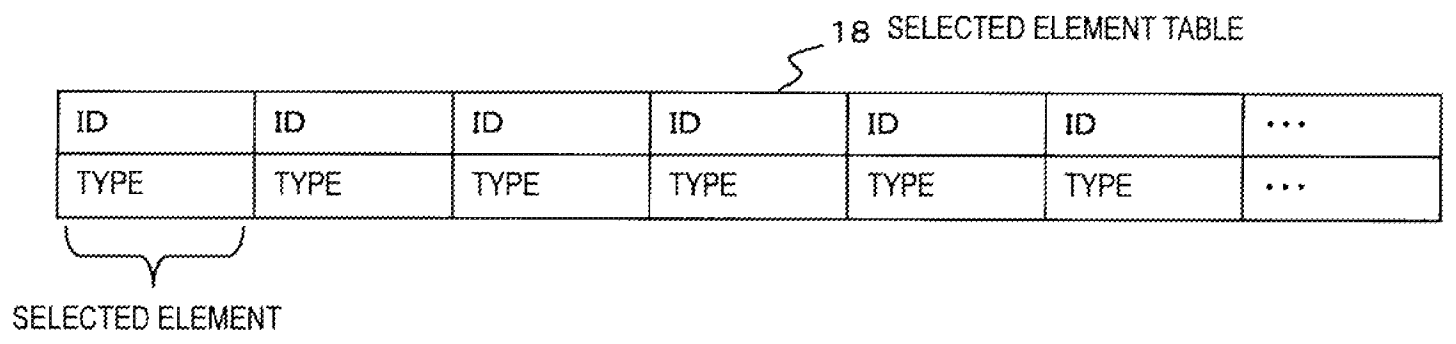

FIG. 19 illustrates an example of the selected element table 18.

The selected element table 18 is a temporary data table created by the circuit edit controller 11 and the constraint edit controller 12. Whenever an element is selected, the ID and type of the element are registered in the selected element table 18. Further, whenever the user selects an element to be edited, the circuit edit controller 11 and the constraint edit controller 12 extract information (ID and type) by which the selected element is identified from the table corresponding to the selected element (part, part pin, or net) or constraint in the circuit diagram (part table 22, part pin table 24, net table 23, or constraint table 41) and registers the information in the selected element table 18.

Figure 20:
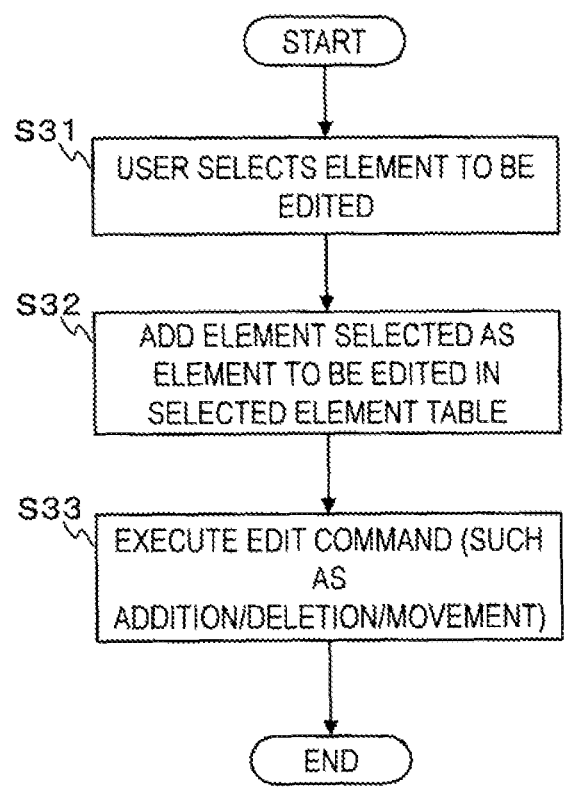
FIG. 20 is a flowchart illustrating a circuit diagram edit process (step S3) in more detail.

FIG. 20 is a flowchart illustrating the circuit diagram edit process (step S3) in more detail.

The circuit edit controller 11 selects an element to be edited in response to user's operation via the input means (step S31), extracts the ID and type of the element from a table corresponding to the selected element (namely the edited element), and adds the extracted ID and type in the selected element table 18 (step S32). The circuit edit controller 11 then executes an edit command (such as addition, deletion, or movement) based on user's operation to update the circuit data (step S33).

Detailed actions of the circuit edit controller 11 in a typical edit process will not be described because they are the same as those of a typical circuit design CAD system in a circuit diagram edit process.

Update Constraint (Step S4):

After the circuit data is edited in step S3, the constraint updater 13 updates relevant constraint data stored in the constraint data storage 4.

Figure 21:
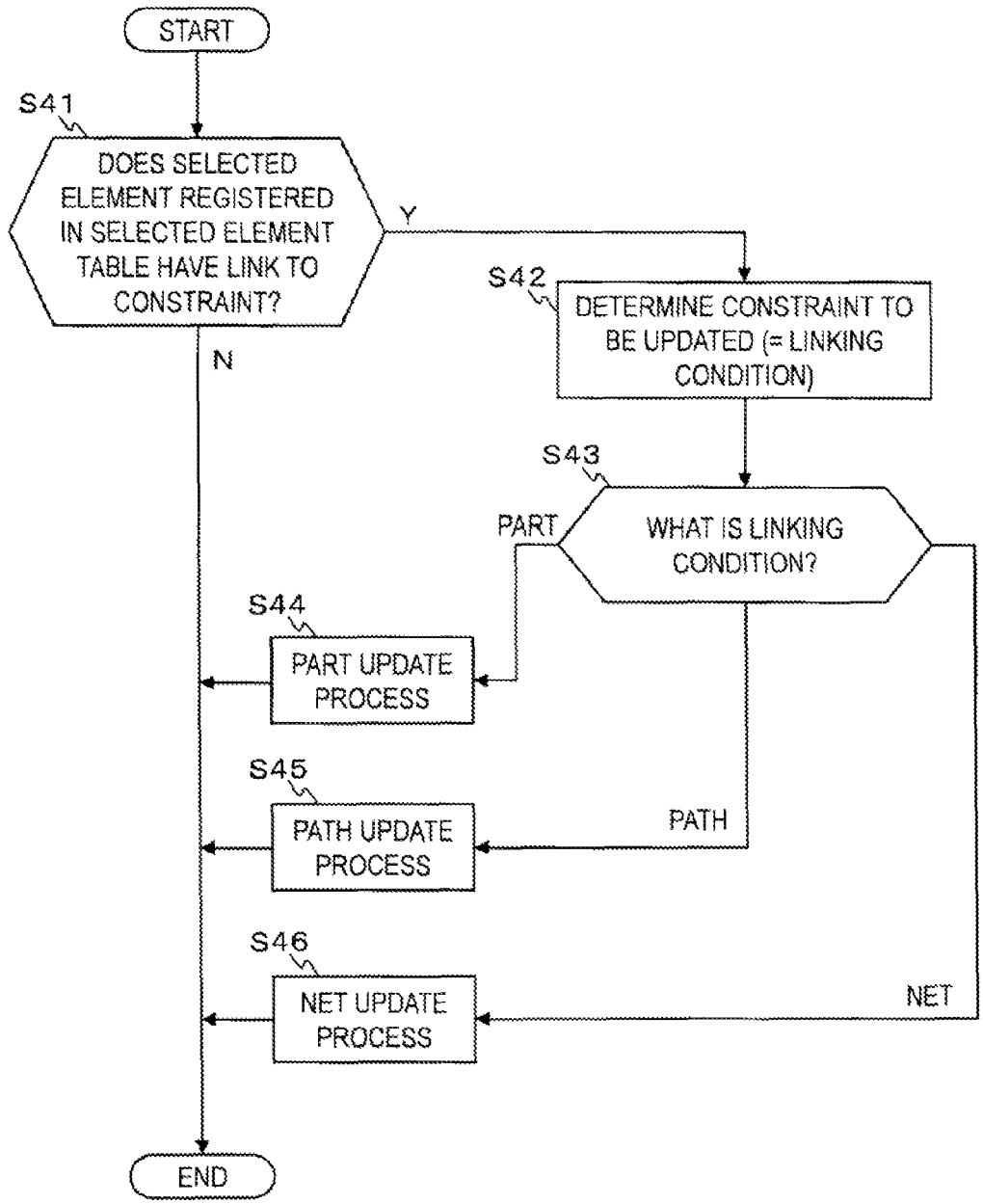
FIG. 21 is a flowchart illustrating a constraint update process (step S4) in more detail.

FIG. 21 is a flowchart illustrating the constraint update process (step S4) in more detail.

Based on the ID of the selected element having been registered in the selected element table 18, the constraint updater 13 checks the corresponding table in the circuit data and determines whether there is a link to any constraint data (step S41).

When the selected element in the selected element table 18 has a link to a constraint (Y in step S41), constraint data to be updated is specified from the ID in the constraint table 41 corresponding to the "link to a constraint" (step S42). When the selected element in the selected element table 18 has no link to any constraint data (N in step S41), the process is terminated.

The constraint updater 13 refers to the constraint setting target in the constraint table 41 in the constraint data having been determined to be updated to determine a linking condition (step S43).

The linking condition is a condition for judging what kind of update is made in accordance with the type of the selected element. For example, a part update process, a path update process, and a net update process are prepared in advance, and the type in constraint setting target table 42 or the constraint type in the constraint table or the combination thereof is used to set the linking condition, by which what kind of update is made is determined.

When the type in the constraint setting target table 42 is "part," the constraint updater 13 determines the linking condition to be "part." When the type in the constraint setting target table 42 is "net," the constraint updater 13 determines the linking condition to be "net." When the constraint type in the constraint table 41 is "wiring length" and the type in the constraint setting target table 42 is "part pin," the constraint updater 13 determines the linking condition to be "path."

When the judgment result is a part (part in step S43), the constraint updater 13 updates the part in step S44. When the judgment result is a path (path in step S43), the constraint updater 13 updates the path in step S45. When the judgment result is a net (net in step S43), the constraint updater 13 updates the net in step S46.

Figure 22:
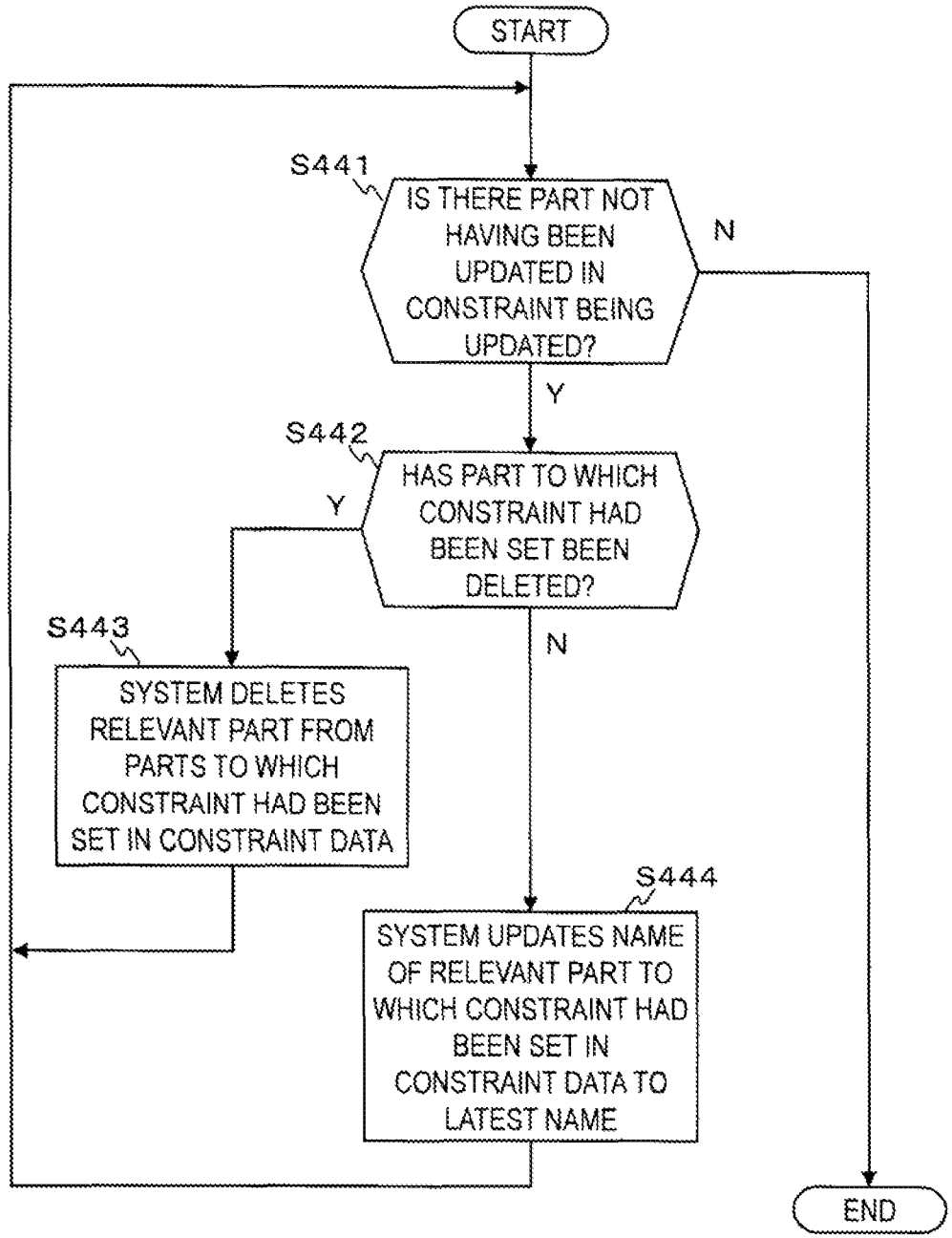
FIG. 22 is a flowchart illustrating a part update process (step S44) in more detail.

FIG. 22 is a flowchart illustrating the part update process (step S44) in more detail.

The constraint updater 13 determines whether there is a part not having been updated in the constraint data being updated (step S441). When there is a part not having been updated (Y in step S441), the constraint updater 13 further determines whether a part to which the constraint had been set has been deleted (step S442). When a part to which the constraint had been set has been deleted (Y in step S442), the constraint updater 13 deletes the part from the parts to which the constraint had been set in the constraint data (step S443). When no part to which the constraint had been set has been deleted (N in step S442), the constraint updater 13 updates the part name of the part to which the constraint had been set in the constraint data to the latest name (step S444).

When there is no part not having been updated (N in step S441), the constraint updater 13 terminates the process.

Figure 23:
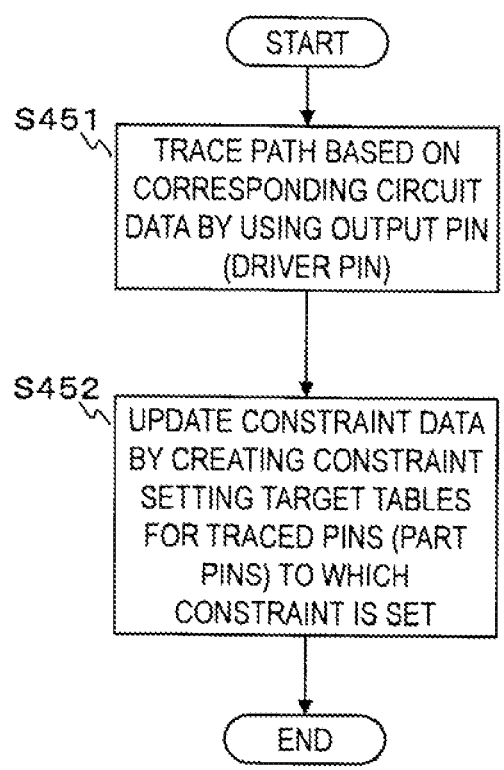
FIG. 23 is flowchart illustrating a path update process (step S45) in more detail.

FIG. 23 is a flowchart illustrating the path update process (step S45) in more detail.

The constraint updater 13 traces a path between elements (part pins) in constraint setting target tables 42 in the constraint data being updated based on the corresponding circuit data by using a driver pin as a key (step S451). The constraint updater 13 then updates the constraint data by creating constraint setting target tables 42 for the traced part pins to which the constraint is set (step S452).

Figure 24:
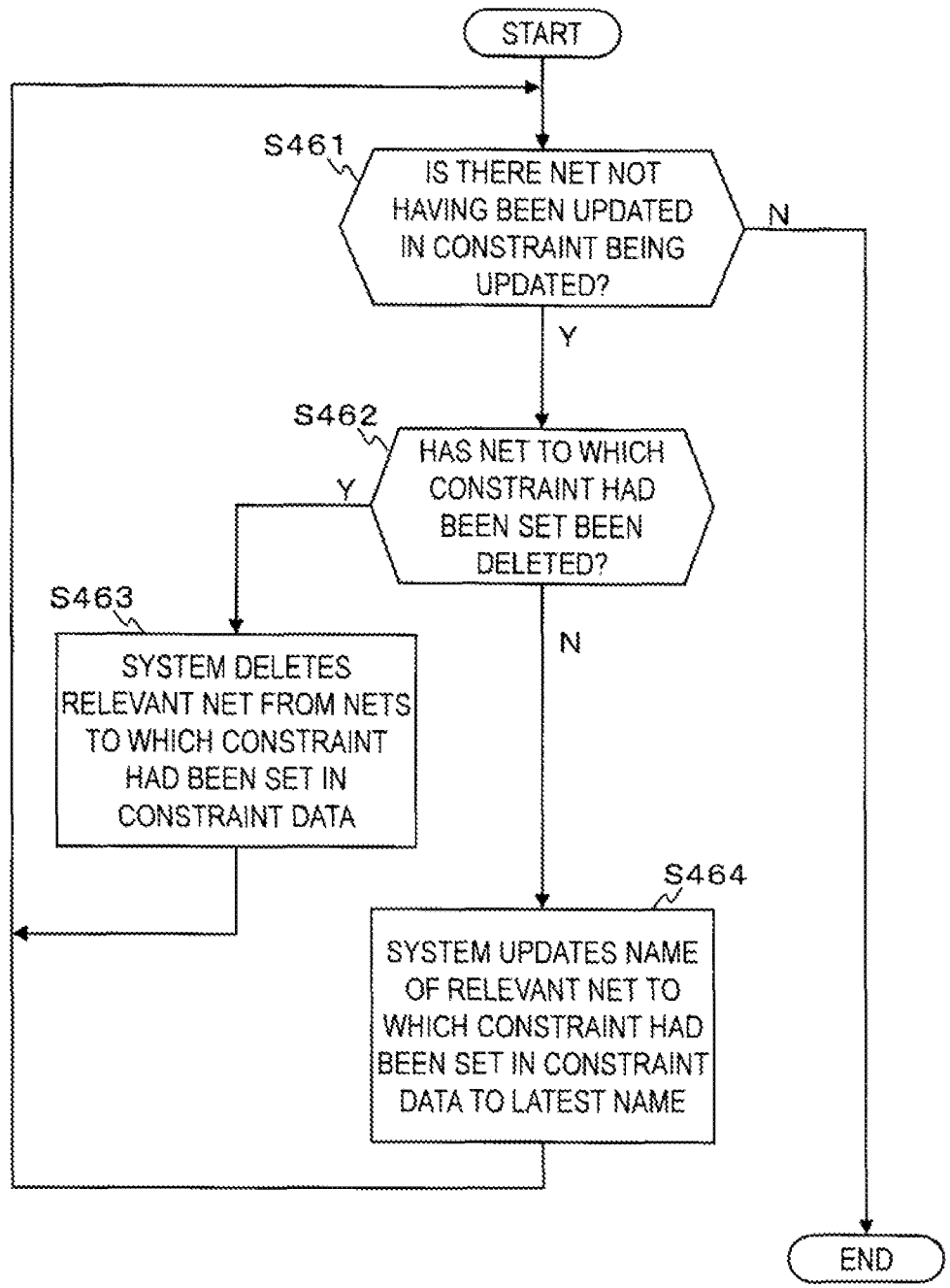
FIG. 24 is a flowchart illustrating a net update process (step S46) in more detail.

FIG. 24 is a flowchart illustrating the net update process (step S46) in more detail.

The constraint updater 13 determines whether there is a net not having been updated in the constraint data being updated (step S461). When there is a net not having been updated (Y in step S461), the constraint updater 13 further determines whether a net to which the constraint had been set has been deleted (step S462). When a net to which the constraint had been set has been deleted (Y in step S462), the constraint updater 13 deletes the net from the nets to which the constraint had been set in the constraint data (step S463). When no net to which the constraint had been set has been deleted (N in step S462), the constraint updater 13 updates the net name of the net to which the constraint had been set in the constraint data to the latest name (step S464). When there is no net not having been updated (N in step S461), the constraint updater 13 terminates the process.

Input/Change Constraint Again (Step S5):

For the constraints not having been updated in the step S4, the constraint edit controller 12 updates the constraint data in the constraint data storage 4 based on user's constraint input operation via the input means. Specifically, among the elements selected and registered in the selected element table 18, the constraint edit controller 12 allows the user to select selected elements to which the constraint had been set but which have not been updated and edits the constraint based on user's operation.

In the circuit design aiding apparatus 10, tables for elements (part, part pin, and net) that form circuit data are linked to constraints, and links are established between the circuit data and the constraint data. A constraint required to be updated can thus be immediately identified when the circuit data is edited, whereby searching the constraint data storage 4 can be omitted.

A specific example of the constraint update process will next be described.

Figure 25:
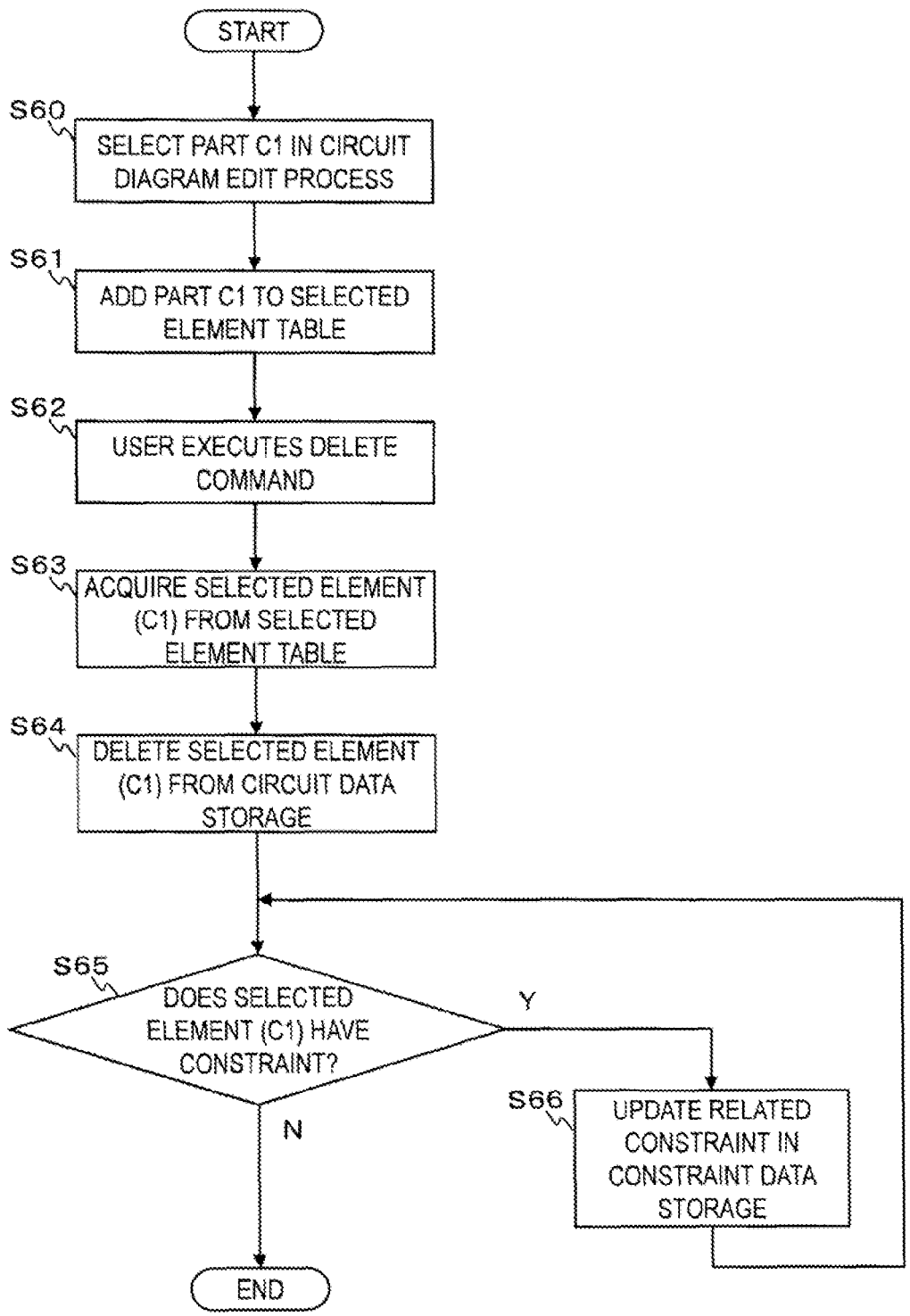
FIG. 25 is an exemplary flowchart of the constraint update process in an embodiment when a part is deleted.

(1) Constraint Update when a Part is Deleted:

FIG. 25 is an exemplary flowchart of the constraint update process when a part is deleted.

FIG. 25 illustrates an example of the constraint update process (step S4) carried out when a constraint on a part is so set in the constraint input process (FIG. 17: step S2) that the parts C1, C2, and C3 are placed in an area within 20 mm from a part I1 (FIG. 11) and then the part C1 is deleted in the circuit diagram edit process (step S3).

When the user edits the circuit data created in the circuit diagram input process (FIG. 17: step S1) and selects the part C1 as an element to be edited in the circuit diagram edit process (step S60), the circuit edit controller 11 adds the ID and type of the part C1 to the selected element table 18 based on the part table 22 for the selected part C1 (step S61).

When the user executes a delete command (step S62), the constraint updater 13 acquires the part table 22 for the part C1 based on the ID of the selected element (part C1) registered in the selected element table 18 (step S63). The circuit edit controller 11 then deletes data related to the part C1 being edited from the circuit data. For example, in the case of the circuit data illustrated in FIG. 8, the part table 22 for the part C1 and the part pin tables 24 for the part pins PC1 and PC2 are deleted (step S64).

The constraint updater 13 determines whether the part C1 has any constraint (ID in constraint table 41) based on the "link to a constraint" in the part table 22 for the selected part (part C1) in the selected element table 18 (step S65). When the selected part (part C1) has a constraint (Y in step S65), the constraint updater 13 updates the relevant constraint data in the constraint data storage 4 based on the setting of the "link to a constraint" (step S66). That is, the constraint updater 13 identifies the constraint table 41 corresponding to the ID set to the "link to a constraint" in the part table 22 for the selected part (part C1), deletes the constraint setting target table 42 for part C1, which is linked by using the "link to a constraint" and to which the constraint has been set, and updates the constraint table 41. On the other hand, when the selected part (part C1) has no constraint (N in step S65), the constraint updater 13 terminates the process.

Figure 26:
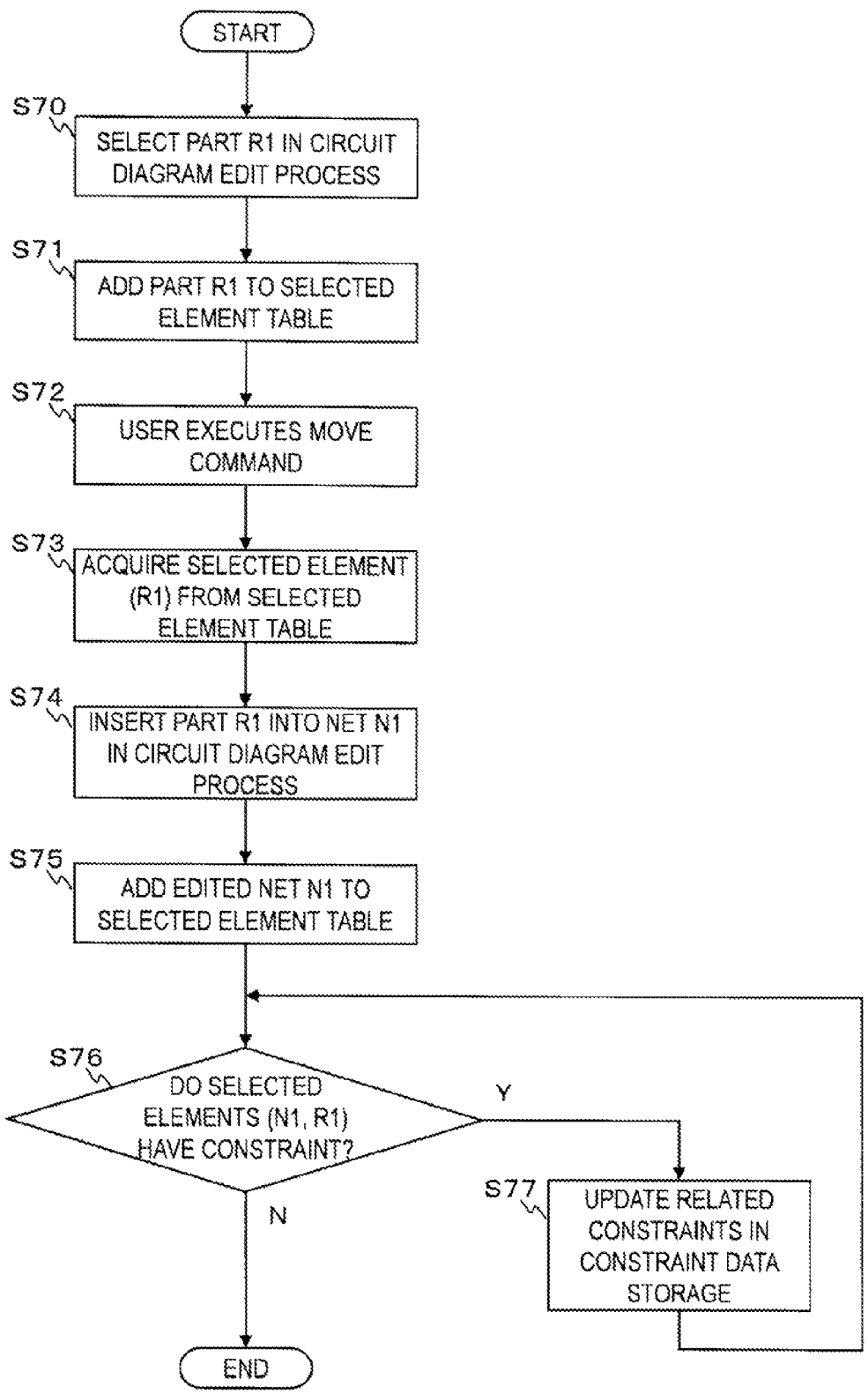
FIG. 26 is an exemplary flowchart of the constraint update process in an embodiment when a part is moved.

(2) Constraint Update when a Part is Moved:

FIG. 26 is an exemplary flowchart of the constraint update process when a part is moved.

FIG. 26 illustrates an example of the constraint update process (step S4) carried out when a constraint on a net is so set in the constraint input process (FIG. 17: step S2) that the wiring length from the part pin 11.1 to the part pin 12.2 is 10 mm or shorter (FIG. 13) and then the path configuration is changed in the circuit diagram edit process (step S3) by inserting a part R1 between the part pin 11.1 and the part pin 12.2.

Figure 27:
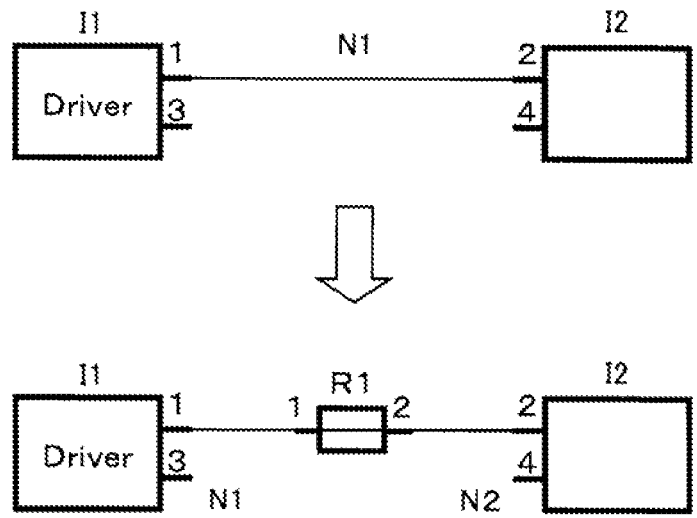
FIG. 27 illustrates a path configuration changed by inserting a part into a net.

FIG. 27 illustrates the path configuration for the net N1 formed of the part pin 11.1 and the part pin 12.2 (upper portion in FIG. 27) and the path configuration changed by inserting the part R1 into the net N1 between the part pin 11.1 and the part pin 12.2 (lower portion in FIG. 27).

Figure 28:
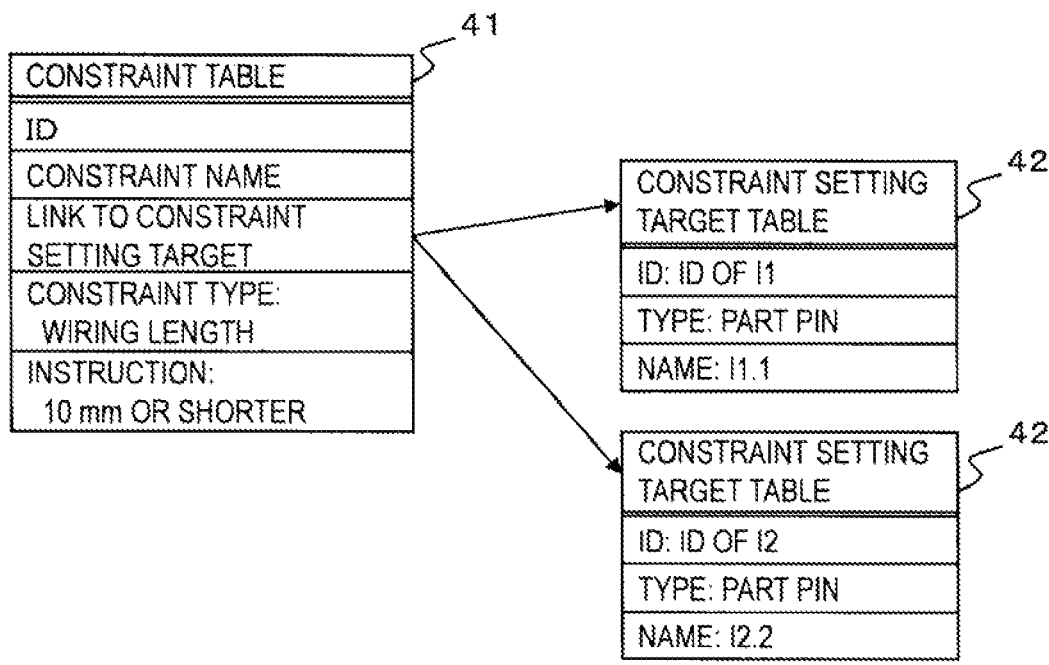
FIG. 28 illustrates an example of constraint data on the net illustrated in an upper portion of FIG. 27.

FIG. 28 illustrates examples of the constraint table 41 and the constraint setting target table 42 representing the constraint on the net N1: "the wiring length from the part pin 11.1 to the part pin 12.2 is 10 mm or shorter."

When the user edits the circuit data created in the circuit diagram input process (FIG. 17: step S1) and selects the part R1 as an element to be edited in the circuit diagram edit process (step S70), the circuit edit controller 11 adds the ID and type of the part R1 to the selected element table 18 based on the part table 22 for the selected part R1 (step S71).

When the user executes a move command (step S72), the constraint updater 13 acquires the part table 22 for the selected part (part R1) based on the ID of the selected element (part R1) registered in the selected element table 18 (step S73).

Further, when the part R1 is inserted into the net N1 (step S74), the circuit edit controller 11 adds the data on the part R1 being edited to the circuit data. For example, in the case of the circuit data illustrated in FIG. 8, the part table 22 for the part R1 is added, and the related link is updated. At this point, the net N1 is changed to a net between the part pin 11.1 and a part pin R1.1, and a net N2 between the part pin 12.2 of the part 12 and a part pin R1.2 of a part R2 and circuit data on the net N2 are newly created.

The circuit edit controller 11 adds the ID and type of the net N1 to the selected element table 18 based on the net table 23 for the net N1, into which the part R1 has been inserted (step S75).

The constraint updater 13 determines whether the part R1 and the net N1 have any constraints (IDs in constraint tables) based on the "link to a constraint" in the part table 22 for the selected part (part R1) in the selected element table 18 and "the link to a constraint" in the net table 23 for the selected part (net N1) in the selected element table 18 (step S76).

When the part R1 or the net N1 has a constraint (Y in step S76), the constraint updater 13 updates the relevant constraint data in the constraint data storage 4 based on the ID set to the "link to a constraint" (step S77). When the net N1 has a constraint, the constraint updater 13 identifies the constraint table 41 corresponding to the ID set to the "link to a constraint" in the net table 23 for the net N1. The constraint updater 13 then traces the path from the part pin 11.1 to the part pin 12.2, to which the constraint has been set, based on the edited circuit data by using a driver pin as a key and detects the part pins R1.1 and R1.2. The constraint updater 13 then adds constraint setting target tables 42 for the detected part pins R1.1 and R1.2, to which constraints are set. On the other hand, when the net N1 and the part R1 have no constraint (N in step S76), the constraint updater 13 terminates the process.

Figure 29:
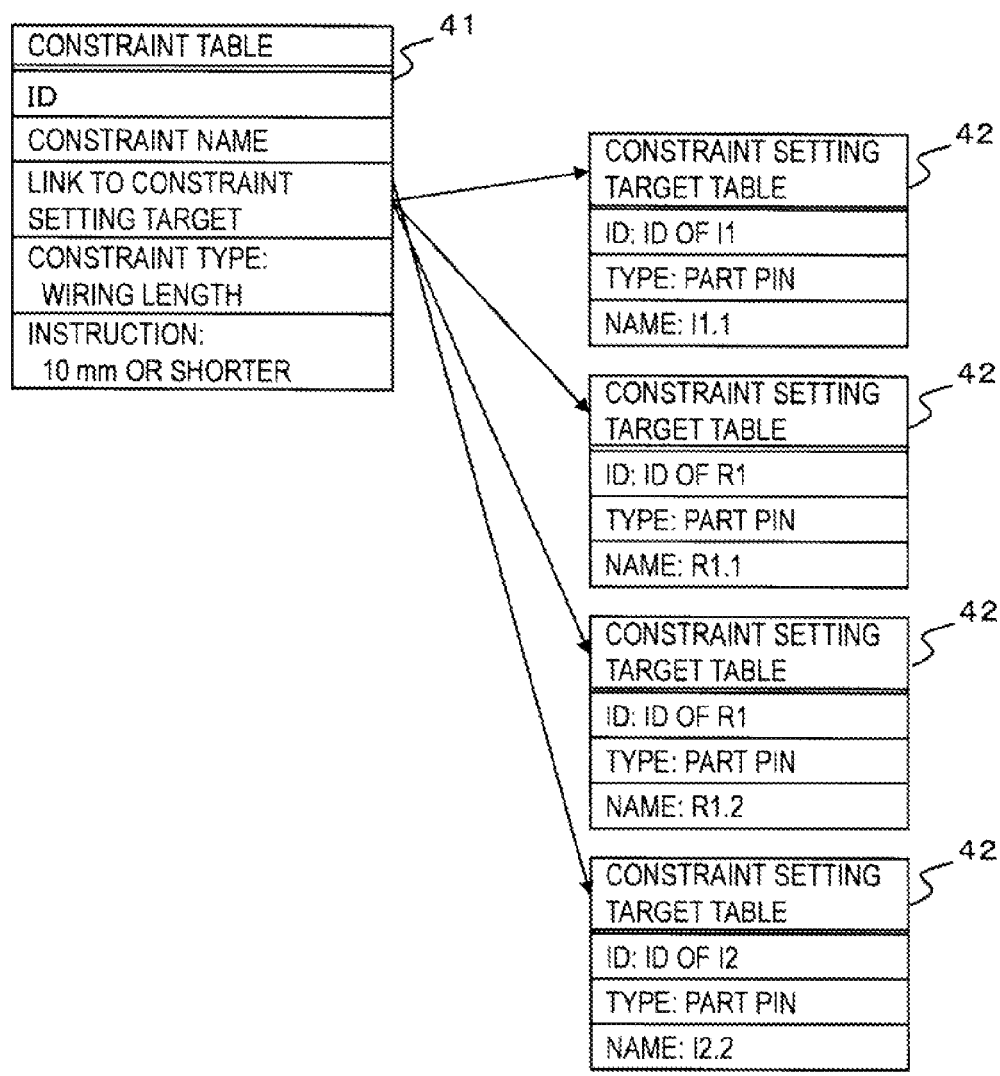
FIG. 29 illustrates an example of the constraint data on the nets illustrated in a lower portion of FIG. 27.

FIG. 29 illustrates examples of the constraint table 41 and the constraint setting target table 42 created when the constraint data representing a constraint on the nets N1 and N2 that "the wiring length from the part pin 11.1 to the part pin 12.2 is 10 mm or shorter" is updated.

Figure 30:
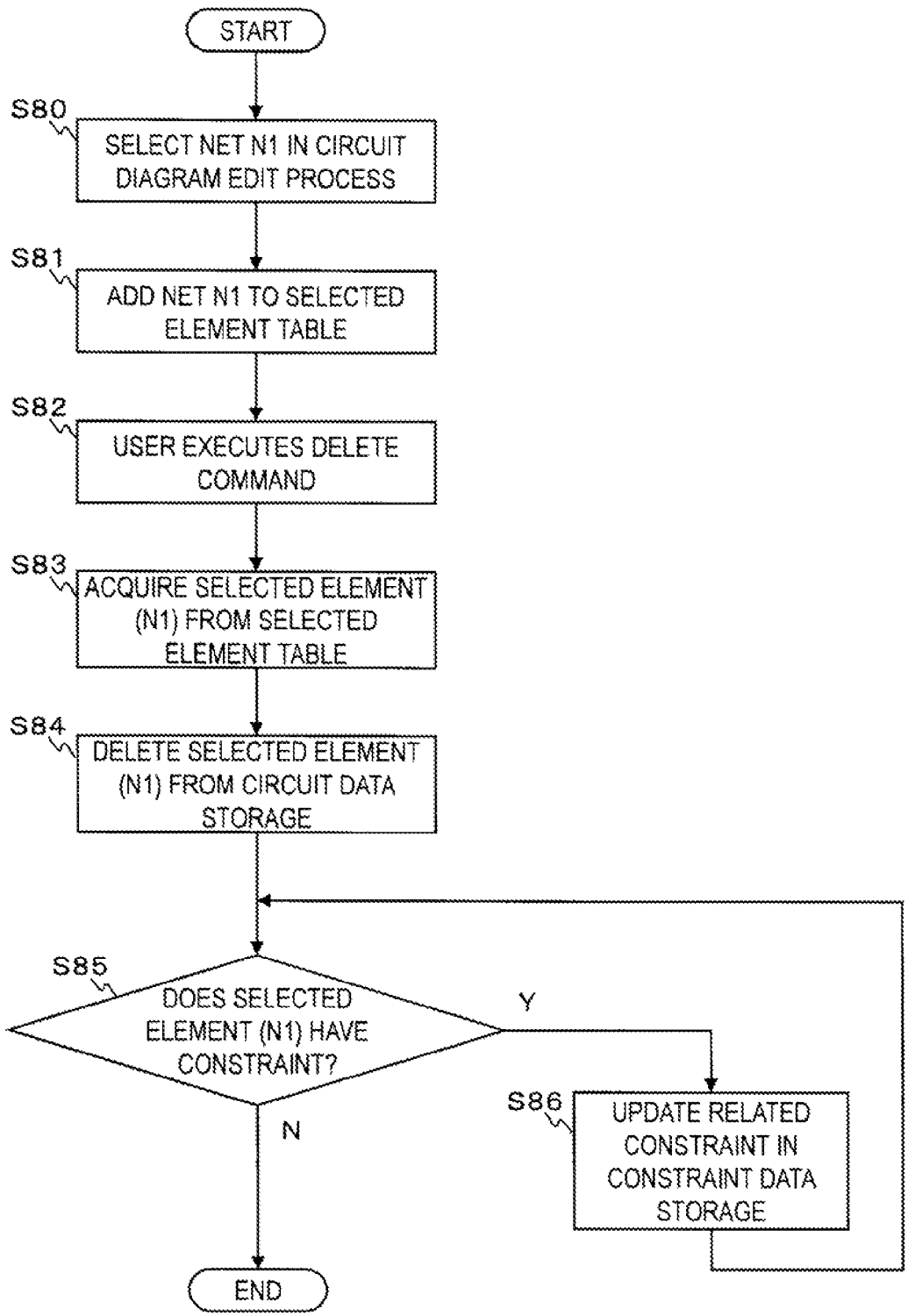
FIG. 30 is an exemplary flowchart of the constraint update process in an embodiment when a net is deleted.

(3) Constraint Update when a Net is Deleted:

FIG. 30 is an exemplary flowchart of the constraint update process when a net is deleted.

FIG. 30 illustrates an example of the constraint update process (step S4) carried out when a constraint on a net, specifically, specifying the number of vias along a specified net, is so set in the constraint input process (FIG. 17: step S2) that at least two vias are necessary along a net N1 (FIG. 15) and then the net is deleted in the circuit diagram edit process (step S3).

When the user edits the circuit data created in the circuit diagram input process (FIG. 17: step S1) and selects the net N1 as an element to be edited in the circuit diagram edit process (step S80), the circuit edit controller 11 adds the ID and type of the net N1 to the selected element table 18 based on the net table 23 for the selected net N1 (step S81).

When the user executes a delete command (step S82), the constraint updater 13 acquires the net table 23 for the net N1 based on the ID of the selected element (net N1) registered in the selected element table 18 (step S83). The circuit edit controller 11 then deletes data related to the net N1 being edited. For example, in the case of the circuit data illustrated in FIG. 8, the net table 23 for the net N1 is deleted (step S84).

The constraint updater 13 determines whether the net N1 has any constraint (ID in constraint table) based on the "link to a constraint" in the net table 23 for the selected part (net N1) in the selected element table 18 (step S85). When the net N1 has a constraint (Y in step S85), the constraint updater 13 updates the relevant constraint data in the constraint data storage 4 based on the ID set to the "link to a constraint" (step S86). The constraint updater 13 deletes the constraint table 41 corresponding to the ID set to the "link to a constraint" in the net table 23 for the net N1.

In the update process described above, the constraint updater 13 does not update the constraint data when no change has been made on a target (element) to which the constraint data corresponding to the selected element registered in the selected element table 18 has been set.

In this case, when the instruction in the constraint table 41 needs to be changed, the user changes the instruction in the process of inputting/changing a constraint again (FIG. 17: steps S5).

To this end, the constraint updater 13 may impart some type of flag indicating that the corresponding constraint data has not been updated to a selected element in the selected element table 18.

When the flag described above is imparted to an element selected and registered in the selected element table 18 and having constraint data not being updated, the element can be identified as having circuit data edited but having constraint data not being updated. The constraint edit controller 12 may therefore present a constraint required to be changed by the user in the process of inputting/changing a constraint again (steps S5) based on the flag found in the selected element table 18 and indicating that the corresponding constraint data has not been updated.

Figure 31:
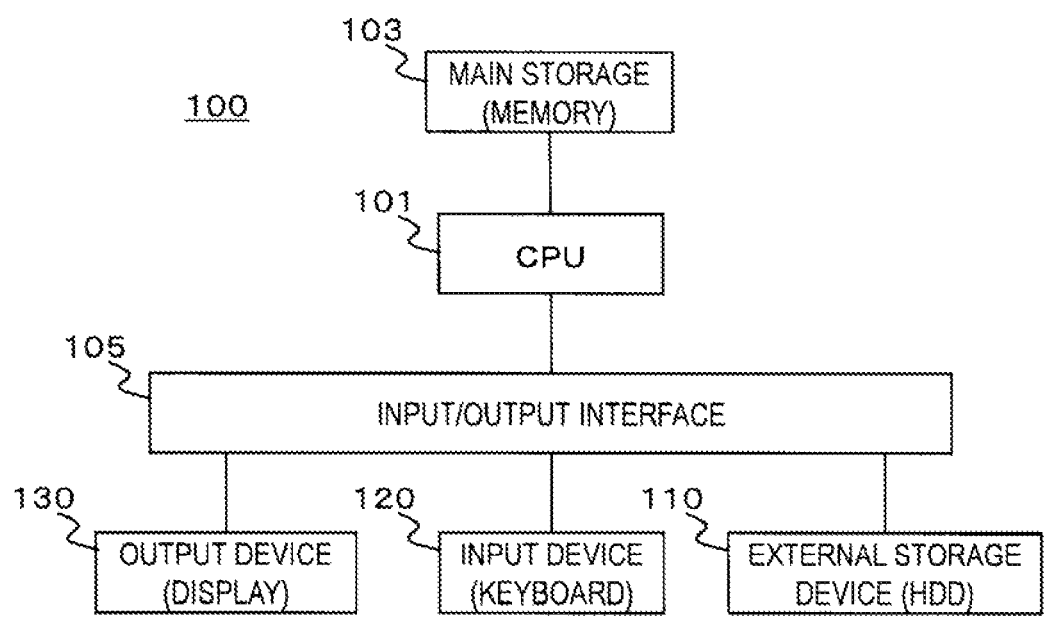
FIG. 31 illustrates an exemplary hardware configuration of the circuit design aiding apparatus 10 disclosed as an embodiment.

FIG. 31 illustrates an exemplary hardware configuration of the circuit design aiding apparatus 10.

As illustrated in FIG. 31, the circuit design aiding apparatus 10 can be a computer 100 including a CPU 101, a main storage (memory) 103, an input/output interface 105, an external storage device 110, an input device (such as a keyboard) 120, and an output device (such as a display) 130.

The circuit design aiding apparatus 10 can alternatively be implemented by a program executable on the computer 100. In this case, a program containing codes for carrying out functional processes of the circuit design aiding apparatus 10 is provided. When the computer 100 executes the thus provided program, the functions of the circuit design aiding apparatus 10 described above are achieved on the computer 100.

That is, the circuit edit controller 11, the constraint edit controller 12, the constraint updater 13, the display unit 14, and the output data generator 15 in the circuit design aiding apparatus 10 can be achieved by the program, and the part data storage 2, the circuit data storage 3, and the constraint data storage 4 can be achieved by the external storage device 110.

The part data storage 2, the circuit data storage 3, and the constraint data storage 4 can alternatively be achieved as a database system independent of the circuit design aiding system 1.

The computer 100 can also read a program directly from a portable recording medium and carry out processes according to the program. Alternatively, the computer 100 can, whenever receiving a program transferred from a server computer, successively carry out processes according to a received program.

Further, the program described above can be recorded on a recording medium readable by the computer 100.

As described above, the circuit design aiding apparatus 10 disclosed as an embodiment of the present invention has the following mechanisms that not only allow, when circuit data having been inputted and stored in the circuit data storage 3 is edited, constraint data stored in the constraint data storage 4 and related to en element having been edited to be identified based on the edited circuit data but also allow an element to which the constraint is set to be updated, whereby the version of the circuit data always coincides with the version of the constraint data.

(1) The circuit design aiding apparatus 10 has a mechanism that holds, when a constraint is created, information representing the link between circuit data related to the constraint and constraint data derived from the constraint.

(2) The circuit design aiding apparatus 10 has a mechanism that uses, when circuit data is edited, an element having been edited and the edited circuit data (such as addition/deletion/movement) as well as the link information described in (1) to identify a constraint to be updated.

(3) The circuit design aiding apparatus 10 has a mechanism that updates a path, that is, updates a constraint on connection (path) between parts, specifically, traces a path based on the edited circuit data by using a driver pin (output pin) as a key.

When a user edits circuit data and attempts to reflect the edited circuit data in the circuit data storage 3 on constraint data in the constraint data storage 4, the processing speed disadvantageously decreases in related art. The mechanisms described above can solve the problem.

Since the circuit design aiding apparatus 10 can identify a constraint required to be updated by following links provided in circuit data, searching operation, which imposes a heavy burden on the apparatus, is unnecessary.

Further, the circuit design aiding apparatus 10 can nearly automatically reflect edited circuit data on constraint data, which are separate data sets from each other, without decrease in processing speed, whereby discrepancy between the circuit data and the constraint data can be reduced.

Further, according to the circuit design aiding apparatus 10, the number of constraint data themselves required to be updated when circuit data is edited decreases, whereby a burden on the user who updates constraints can be reduced.

According to the circuit design aiding apparatus described above, when circuit data and constraint data related thereto are linked and stored, and a constraint has been set to a circuit element edited in a circuit data edit process, the constraint data on the edited element is identified and the constraint is updated.

In this way, when a user edits the circuit data, constraint data on the element having been edited is identified by using the link between the edited circuit data and the related constraint data. Therefore, constraint data required to be updated can be identified without searching the constraint data storage, and the element to which the constraint has been set can be updated.

It is therefore possible to reduce a burden of updating constraint data when circuit data is edited.

All examples and conditional language recited herein are intended for pedagogical purposes to aid the reader in understanding the invention and the concepts contributed by the inventor to furthering the art, and to be construed as being without limitation to such specifically recited examples and conditions, nor does the organization of such examples in the specification relate to a showing of the superiority and inferiority of the invention. Although the embodiment(s) of the present invention have been described in detail, it should be understood that the various changes, substitutions, and alterations could be made hereto without departing from the spirit and scope of the invention.

What is claimed is:

1. A printed circuit board design aiding apparatus comprising:
   a circuit data storage that stores circuit data for each circuit diagram, the circuit data containing elements that form a printed circuit board and links to constraints having been set;
   a constraint data storage that stores constraint data for each circuit diagram, the constraint data containing an element which is used in the printed circuit board and to which a constraint is set and contents of the constraint;

a circuit edit controller that edits contents of the circuit data stored in the circuit data storage and updates the circuit data so that the updated circuit data reflects the edited contents; and a constraint updater that extracts circuit data on an element having been edited from the circuit data storage, identifies constraint data related to the edited element from the constraint data storage based on a link to a constraint in the extracted circuit data, and changes contents of the identified constraint data.

2. The printed circuit board design aiding apparatus according to claim 1, wherein when an instruction in the identified constraint data is about a path of an element in the printed circuit board, the constraint updater not only traces a path by using an output pin of the element as a key between the element and another element to which the constraint data has been set based on the circuit data containing the edited element but also updates the element to which the constraint has been set based on the element identified in the tracing operation.

3. A non-transitory computer-readable recording medium storing a printed circuit board design aiding program that instructs a computer having:

a circuit data storage that stores circuit data for each circuit diagram, the circuit data containing elements that form a printed circuit board and links to constraints having been set, and a constraint data storage that stores constraint data for each circuit diagram, the constraint data containing an element which is used in the printed circuit board and to which a constraint is set and contents of the constraint, the program instructing the computer to carry out:

a circuit data edit process of editing contents of the circuit data stored in the circuit data storage; and a constraint update process of extracting circuit data on an element having been edited from the circuit data storage, identifying constraint data related to the edited element from the constraint data storage based on a link to a constraint in the extracted circuit data, and changing contents of the identified constraint data.

4. The non-transitory computer-readable recording medium storing the printed circuit board design aiding program according to claim 3, wherein in the constraint update process, when an instruction in the identified constraint data is about a path of an element in the printed circuit board, the program instructs the computer to carry out:

tracing a path by using an output pin of the element as a key between the element and another element to which the constraint data has been set based on the circuit data containing the edited element; and updating the element to which the constraint has been set based on the element identified in the tracing operation.

5. A printed circuit board design aiding apparatus comprising:

a circuit data storage that stores circuit data for each circuit diagram, the circuit data containing elements that form a printed circuit board, nets representing connections between the elements, and links to constraints having been set to each element or net;

a constraint data storage that stores constraint data for each circuit diagram, the constraint data containing contents of the constraints for the elements or the nets;

a circuit edit controller that edits contents of the circuit data stored in the circuit data storage and updates the circuit data so that the updated circuit data reflects the edited contents; and a constraint updater that extracts circuit data on an element having been edited from the circuit data storage, identifies constraint data related to the edited element from the constraint data storage based on the links in the extracted circuit data, and changes contents of the identified constraint data.

* * * * *